(12) United States Patent
Na

(10) Patent No.: US 12,426,456 B2
(45) Date of Patent: Sep. 23, 2025

(54) DISPLAY DEVICE

(71) Applicant: Samsung Display Co., LTD., Yongin-si (KR)

(72) Inventor: Ji Su Na, Yongin-si (KR)

(73) Assignee: SAMSUNG DISPLAY CO., LTD., Gyeonggi-do (KR)

( * ) Notice: Subject to any disclaimer, the term of this patent is extended or adjusted under 35 U.S.C. 154(b) by 1019 days.

(21) Appl. No.: 17/402,490

(22) Filed: Aug. 13, 2021

(65) Prior Publication Data

US 2022/0059641 A1 Feb. 24, 2022

(30) Foreign Application Priority Data

Aug. 21, 2020 (KR) ........................ 10-2020-0105182

(51) Int. Cl.
*H10K 59/131* (2023.01)
*H10K 59/121* (2023.01)

(52) U.S. Cl.
CPC ....... *H10K 59/131* (2023.02); *H10K 59/1213* (2023.02)

(58) Field of Classification Search
CPC ........... H10K 59/131; H10K 2102/311; H10K 77/111; G02F 1/133305; G02F 1/1345; G02F 1/13452; G10K 77/111; G06G 2203/04112
See application file for complete search history.

(56) References Cited

U.S. PATENT DOCUMENTS

| | | |
|---|---|---|
| 9,063,381 B2 | 6/2015 | Fujiwara |
| 9,557,607 B2 | 1/2017 | Fujiwara |
| 10,734,471 B2 | 8/2020 | Park et al. |
| 11,171,195 B2 | 11/2021 | Kim et al. |
| 11,963,415 B2 | 4/2024 | Kim et al. |
| 2012/0268002 A1 | 10/2012 | Osako et al. |
| 2017/0146835 A1 | 5/2017 | Fujiwara |
| 2018/0337364 A1* | 11/2018 | Kwon ................. H10K 59/131 |

(Continued)

FOREIGN PATENT DOCUMENTS

| | | |
|---|---|---|
| JP | 2013257475 A | 12/2013 |
| KR | 1020150016784 A | 2/2015 |

(Continued)

OTHER PUBLICATIONS

Extended European Search Report—European Application No. 21192061.6 dated Feb. 2, 2022, citing references listed within.

(Continued)

*Primary Examiner* — Eric K Ashbahian
(74) *Attorney, Agent, or Firm* — CANTOR COLBURN LLP

(57) ABSTRACT

A display device includes a display area including sub-pixels for displaying an image, a non-display area adjacent to the display area, and a first driving voltage line disposed in the non-display area and including at least one straight portion defining a plurality of first straight holes and a bent portion defining a plurality of first bent holes. The first driving voltage line is disposed linearly in the straight portion, and is bent in the bent portion. The first bent hole and the first straight hole have different sizes from each other in a plan view. The first bent hole and the first straight hole is adjacent to each other in a longitudinal direction of the first driving voltage line.

23 Claims, 24 Drawing Sheets

(56) References Cited

U.S. PATENT DOCUMENTS

| | | | |
|---|---|---|---|
| 2019/0006442 A1* | 1/2019 | Byun | H10K 59/873 |
| 2020/0119124 A1 | 4/2020 | Ahn et al. | |
| 2020/0161412 A1* | 5/2020 | Lin | H10K 59/18 |
| 2020/0266255 A1 | 8/2020 | Jung et al. | |
| 2022/0069057 A1 | 3/2022 | Kim et al. | |
| 2022/0173202 A1* | 6/2022 | Saitoh | H05B 33/12 |

FOREIGN PATENT DOCUMENTS

| | | |
|---|---|---|
| KR | 1020180047536 A | 5/2018 |
| KR | 1020190051513 A | 5/2019 |
| KR | 1020190089110 A | 7/2019 |

OTHER PUBLICATIONS

Extended European Search Report dated Jul. 4, 2023, issued in corresponding European Patent Application No. EP 21192061.6.

* cited by examiner

DISPLAY DEVICE

This application claims priority to Korean Patent Application No. 10-2020-0105182 filed on Aug. 21, 2020, and all the benefits accruing therefrom under 35 U.S.C. § 119, the content of which in its entirety is herein incorporated by reference.

BACKGROUND

1. Field

Embodiments of the invention relate to a display device.

2. Description of the Related Art

With the development of information society, requirements for a display device for displaying images have increased in various forms. For example, the display device is applied to various electronic appliances such as smart phones, digital cameras, notebook computers, navigators, and smart televisions.

The display device may be a flat panel display device such as a liquid crystal display device, a field emission display device, or a light emitting display device. The light emitting display device includes an organic light emitting display device including an organic light emitting element, an inorganic light emitting display device including an inorganic light emitting element such as an inorganic semiconductor, and a micro-light emitting display device including a micro-light emitting element.

In the case of an organic light emitting display device, thin film transistors are formed on a substrate, a planarization layer is formed on the thin film transistors, and a light emitting element having an anode electrode, a light emitting layer, and a cathode electrode is formed on the planarization layer. Further, in order to protect the light emitting layer and the cathode electrode from oxygen and moisture, an encapsulation layer including multiple organic and inorganic layers is formed on the light emitting element.

SUMMARY

In this case, the planarization layer may be formed of an organic layer such as a photo acryl layer or a polyimide layer. Since the planarization layer absorbs moisture when exposed to the atmosphere, in the process of depositing the planarization layer, moisture in vacuum deposition equipment is removed before the substrate on which the thin film transistors are formed is put into the vacuum deposition equipment. However, despite such efforts, moisture may remain in the planarization layer. In this case, the light emitting layer of the light emitting element may be damaged by moisture remaining in the planarization layer, and sub-pixels in which the light emitting layer of the light emitting element is damaged by outgas may be displayed as black dots.

Embodiments of the invention provide a display device that can reduce or prevent a light emitting layer of a light emitting element from being damaged by outgas of an organic layer.

An embodiment of the invention provides a display device including a display area including sub-pixels for displaying an image, a non-display area adjacent to the display area, and a first driving voltage line disposed in the non-display area and including a straight portion defining a plurality of first straight holes and a bent portion defining a plurality of first bent holes. The first driving voltage line is disposed linearly in the straight portion, and is bent in the bent portion. The first bent hole and the first straight hole have different sizes from each other. The first bent hole and the first straight hole is adjacent to each other in a longitudinal direction of the first driving voltage line.

The size of the first bent hole may be larger than the size of the first straight hole.

Two first bent holes among the plurality of first bent holes may have different sizes from each other, and the two first bent holes may be adjacent to each other in a latitudinal direction of the first driving voltage line.

First one of the two first bent holes may be disposed outside second one of the two first bent holes. The size of the first one may be larger than the size of the second one.

A distance between two first straight holes among the plurality of first straight holes may be the same as a distance between the first bent hole and the first straight hole. The two first straight holes may be adjacent to each other in the longitudinal direction of the first driving voltage line.

Four bent holes adjacent to each other among the first bent holes and the first straight holes may be defined as a first adjacent hole, a second adjacent hole, a third adjacent hole, and a fourth adjacent hole. An area of a quadrangle connecting a center point of the first adjacent hole, a center point of the second adjacent hole, a center point of the third adjacent hole, and a center point of the fourth adjacent hole may be defined as a first bent area CA1. An overlap area of the first bent area CA1 and the first adjacent hole may be defined as a first bent overlap area COA1, an overlap area of the first bent area CA1 and the second adjacent hole is defined as a second bent overlap area COA2, an overlap area of the first bent area (CA1) and the third adjacent hole is defined as a third bent overlap area COA3, and an overlap area of the first bent area CA1 and the fourth adjacent hole is defined as a fourth bent overlap area COA4. A ratio CR1 of an area of the first bent holes to the first bent area CA1 may satisfy $$CR1 = \frac{COA1 + COA2 + COA3 + COA4}{CA1} \times 100.$$

The ratio CR1 of the area of the first bent holes to the first bent area CA1 may be 15 percentages (%) to 25%.

Four first straight holes adjacent to each other among the first straight holes may be defined as a first adjacent straight hole, a second adjacent straight hole, a third adjacent straight hole, and a fourth adjacent straight hole. An area of a quadrangle connecting a center point of the first adjacent straight hole, a center point of the second adjacent straight hole, a center point of the third adjacent straight hole, and a center point of the fourth adjacent straight hole is defined as a first straight area SA1, an overlap area of the first straight area SA1 and the first adjacent straight hole may be defined as a first straight overlap area SOA1, an overlap area of the first straight area SA1 and the second adjacent straight hole is defined as a second straight overlap area SOA2, an overlap area of the first straight area SA1 and the third adjacent straight hole may be defined as a third straight overlap area SOA3, and an overlap area of the first straight area SA1 and the fourth adjacent straight hole is defined as a fourth straight overlap area SOA4. A ratio SR1 of an area of the first straight holes to the first straight area SA1 may satisfy $$SR1 = \frac{SOA1 + SOA2 + SOA3 + SOA4}{SA1} \times 100.$$

The ratio SR1 of the area of the first straight holes to the first straight area SA1 is 15% to 25%.

A difference between the ratio SR1 of the first straight holes to the first straight area SA1 and the ratio CR1 of the first bent holes to the first bent area CA1 may be less than 1%.

The display device may further include a second driving voltage line disposed in the non-display area, having the straight portion and the bent portion, and electrically connected to the first driving voltage line. The second driving voltage line may include a plurality of second straight holes arranged in the straight portion and a plurality of second bent holes arranged in the bent portion. The first straight holes, the second straight holes, the first bent holes, and the second bent holes may not overlap each other in the plan view.

The second bent hole and the second straight hole may have different sizes from each other. The second bent hole and the second straight hole may be adjacent to each other in a longitudinal direction of the second driving voltage line.

Two second bent holes among the second bent holes may have different sizes from each other. The two second bent holes may be adjacent to each other in a latitudinal direction of the second driving voltage line.

First one of the two second bent holes may be disposed outside second one of the two second bent holes. The size of the first one may be larger than the size of the second one.

A distance between two second straight holes among the plurality of second straight holes may be the same as a distance between the second bent hole and the second straight hole. The two second straight holes may be adjacent to each other in the longitudinal direction of the second driving voltage line.

A size of the second straight hole may be the same as the size of the first straight hole.

The sub-pixel may include a pixel transistor including a gate electrode, a source electrode, and a drain electrode, a connection electrode disposed on a first planarization layer disposed on the pixel transistor and connected to the source electrode and the drain electrode, and a pixel electrode disposed on a second planarization layer disposed on the connection electrode and connected to the connection electrode.

The first driving voltage line disposed on the second planarization layer may include the same material as the pixel electrode.

The second driving voltage line disposed on the first planarization layer may include the same material as the connection electrode.

The first driving voltage line may include a plurality of third straight holes arranged in the straight portion and a plurality of third bent holes disposed in the bent portion. A size of the third bent hole may be larger than a size of the third straight hole.

A distance between two third straight holes of the plurality of third straight holes may be the same as a distance between the third bent hole and the third straight hole adjacent to each other in the longitudinal direction of the first driving voltage line. The two third straight holes may be adjacent to each other in the longitudinal direction of the first driving voltage line.

The size of the third straight hole may be larger than the size of the first straight hole.

An embodiment of the invention provides a display device including: a substrate including a first side, a second side, and a first corner, where the first corner is round and at which the first side meets the second side; a display area disposed on the substrate and including pixels for displaying an image; and a driving voltage line disposed at the first side and the first corner in a non-display area adjacent to the display area. The driving voltage line includes a straight portion defining a plurality of straight holes and a bent portion defining a plurality of bent holes, is disposed linearly in the straight portion, and is bent in the bent portion. Two bent holes among the plurality of bent holes have different sizes from each other. The two bent holes are adjacent to each other in a latitudinal direction of the driving voltage line.

First one of two bent holes may be disposed outside second one of the two bent holes. The size of the first one may be larger than the size of the second one.

The bent hole and the straight hole may have different sizes from each other. The bent hole and the straight hole may be adjacent to each other in a longitudinal direction of the driving voltage line.

The size of the bent hole may be larger than the size of the straight hole.

A distance between two straight holes among the plurality of straight holes may be the same as a distance between the bent hole and the straight hole adjacent to each other. The two straight holes may be adjacent to each other in the longitudinal direction of the driving voltage line.

BRIEF DESCRIPTION OF THE DRAWINGS

These and/or other features of the invention will become apparent and more readily appreciated from the following description of the embodiments, taken in conjunction with the accompanying drawings, in which.

DETAILED DESCRIPTION

Figure 1:
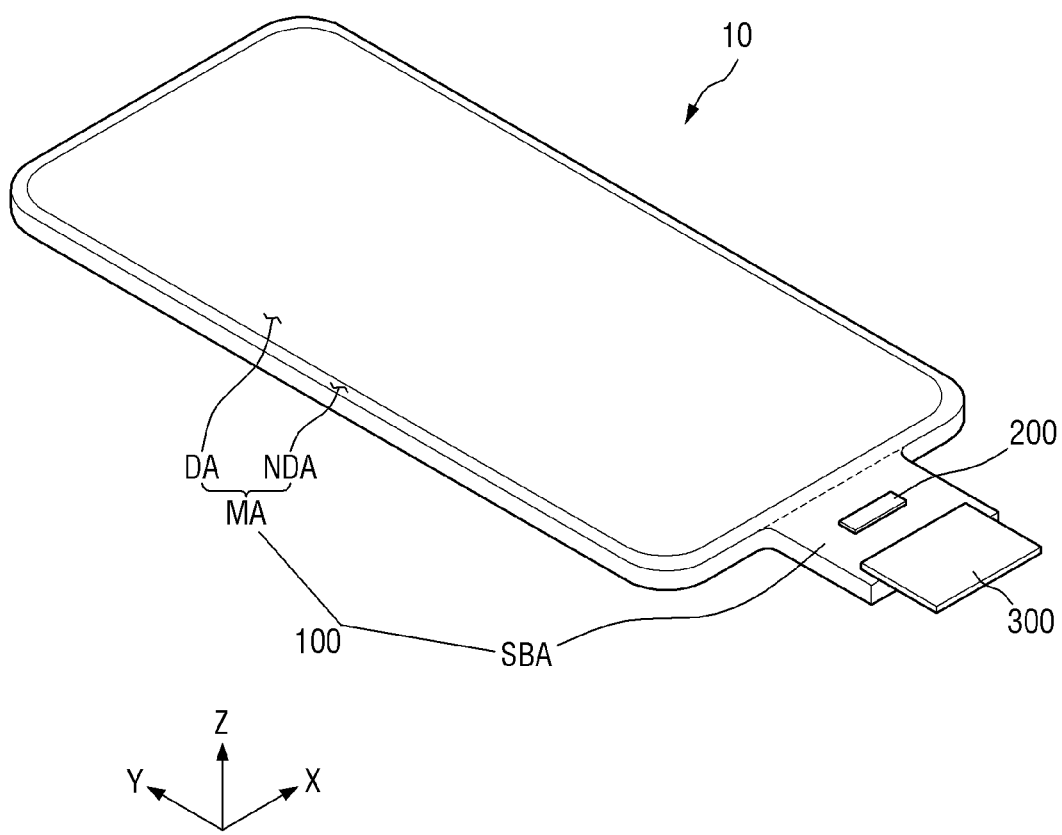
FIG. 1 is a perspective view of a display device according to an embodiment.

Embodiments of the invention will now be described more fully hereinafter with reference to the accompanying drawings, in which preferred embodiments of the invention are shown. The invention may, however, be embodied in different forms and should not be construed as limited to the embodiments set forth herein. Rather, these embodiments are provided so that this disclosure will be thorough and complete, and will fully convey the scope of the invention to those skilled in the art. The same reference numbers indicate the same components throughout the specification. In the attached drawing figures, the thickness of layers and regions is exaggerated for clarity.

It will be understood that, although the terms "first," "second," "third" etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, "a first element," "component," "region," "layer" or "section" discussed below could be termed a second element, component, region, layer or section without departing from the teachings herein.

It will also be understood that when a layer is referred to as being "on" another layer or substrate, it can be directly on the other layer or substrate, or intervening layers may also be present. In contrast, when an element is referred to as being "directly on" another element, there are no intervening elements present.

The terminology used herein is for the purpose of describing particular embodiments only and is not intended to be limiting. As used herein, the singular forms "a," "an," and "the" are intended to include the plural forms, including "at least one," unless the content clearly indicates otherwise. "Or" means "and/or." "At least one of A and B" means "A and/or B." As used herein, the term "and/or" includes any and all combinations of one or more of the associated listed items. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system).

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the disclosure, and will not be interpreted in an idealized or overly formal sense unless expressly so defined herein.

Embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. A region illustrated or described as flat may, typically, have rough and/or nonlinear features, for example. Moreover, sharp angles that are illustrated may be rounded. Thus, the regions illustrated in the drawing figures are schematic in nature and their shapes are not intended to illustrate the precise shape of a region and are not intended to limit the scope of the claims.

Hereinafter, embodiments of the invention will be described in detail with reference to the accompanying drawings.

FIG. 1 is a perspective view of a display device according to an embodiment.

Referring to FIG. 1, a display device 10, which is a device for displaying a moving image or a still image, may be used as a display screen of various products such as televisions, notebooks, monitors, billboards, internet of things ("IOTs") as well as portable electronic appliances such as mobile phones, smart phones, tablet personal computers ("tablet PCs"), smart watches, watch phones, mobile communication terminals, electronic notebooks, electronic books, portable multimedia players ("PMPs"), navigators, and ultra mobile PCs ("UMPCs").

The display device 10 may be a light emitting display device such as an organic light emitting display device using an organic light emitting diode, a quantum dot light emitting display device including a quantum dot light emitting layer, an inorganic light emitting display device including an inorganic semiconductor, or a micro light emitting display device using a micro light emitting diode ("LED"). Hereinafter, the display device 10 will be mainly described as an organic light emitting display device, but the present invention is not limited thereto.

The display device 10 includes a display panel 100, a display driving circuit 200, and a circuit board 300.

The display panel 100 may have a rectangular planar shape having short sides (i.e., latitudinal sides) in the first direction (i.e., X-axis direction) and long sides (i.e., longitudinal sides) in the second direction (i.e., Y-axis direction). The corner where the short side in the first direction (i.e., X-axis direction) meets the long side in the second direction (i.e., Y-axis direction) may have a round planar shape. The planar shape of the display panel 100 according to the invention is not limited to a rectangular shape, and may have another polygonal shape, circular shape, or elliptical shape. The display panel 100 may be flexible to be bent, warped, folded, or rolled.

The display panel 100 may include a main area MA and a sub-area SBA.

The main area MA may include a display area DA displaying an image, and a non-display area NDA which is a peripheral area of the display area DA. The display area DA may include sub-pixels displaying an image. The sub-area SBA may protrude from one side of the main area MA in the second direction (i.e., Y-axis direction).

Although it is illustrated in FIG. 1 that the sub-area is unfolded, the sub-area SBA may be bent, and in this case, the sub-area SBA may be disposed on the lower surface of the display panel 100. When the sub-area SBA is bent, the sub-area SBA may overlap the main area MA in the thickness direction (i.e., Z-axis direction) of the substrate SUB. The display driving circuit 200 may be disposed in the sub-area SBA.

The display driving circuit 200 may generate signals and voltages for driving the display panel 100. The display driving circuit 200 may be an integrated circuit ("IC"), and may be attached onto the display panel 100 by a chip on glass ("COG") method, a chip on plastic ("COP") method, or an ultrasonic bonding method. However, the present invention is not limited thereto. For example, the display driving circuit 200 may be attached onto the circuit board 300 by a chip on glass (COG) method.

The circuit board 300 may be attached to one end of the sub-area SBA of the display panel 100. Thus, the circuit board 300 may be electrically connected to the display panel 100 and the display driving circuit 200. The display panel 100 and the display driving circuit 200 may receive digital video data, timing signals, and driving voltages through the circuit board 300. The circuit board 300 may be a flexible printed circuit board, a printed circuit board, or a flexible film such as a chip on film.

Figure 2:
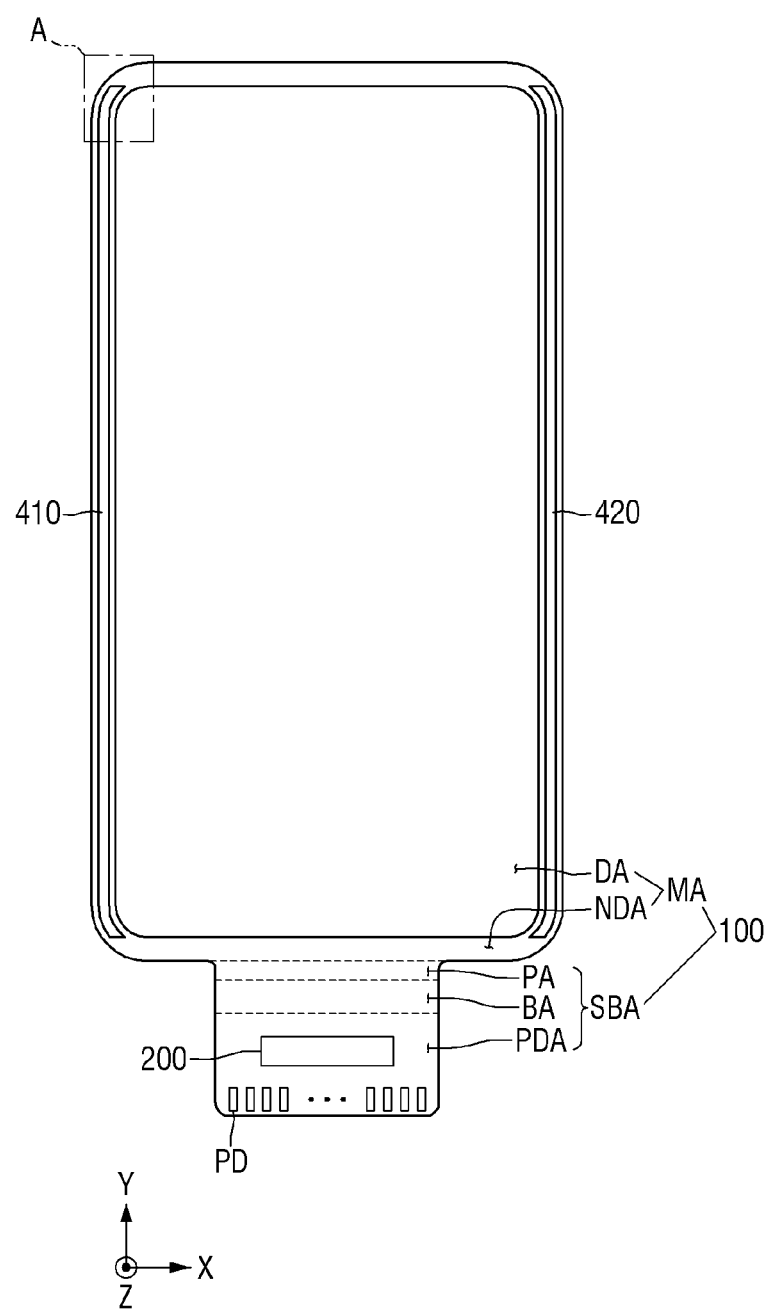
FIGS. 2 and 3 are plan views of a display device according to an embodiment.
Figure 3:
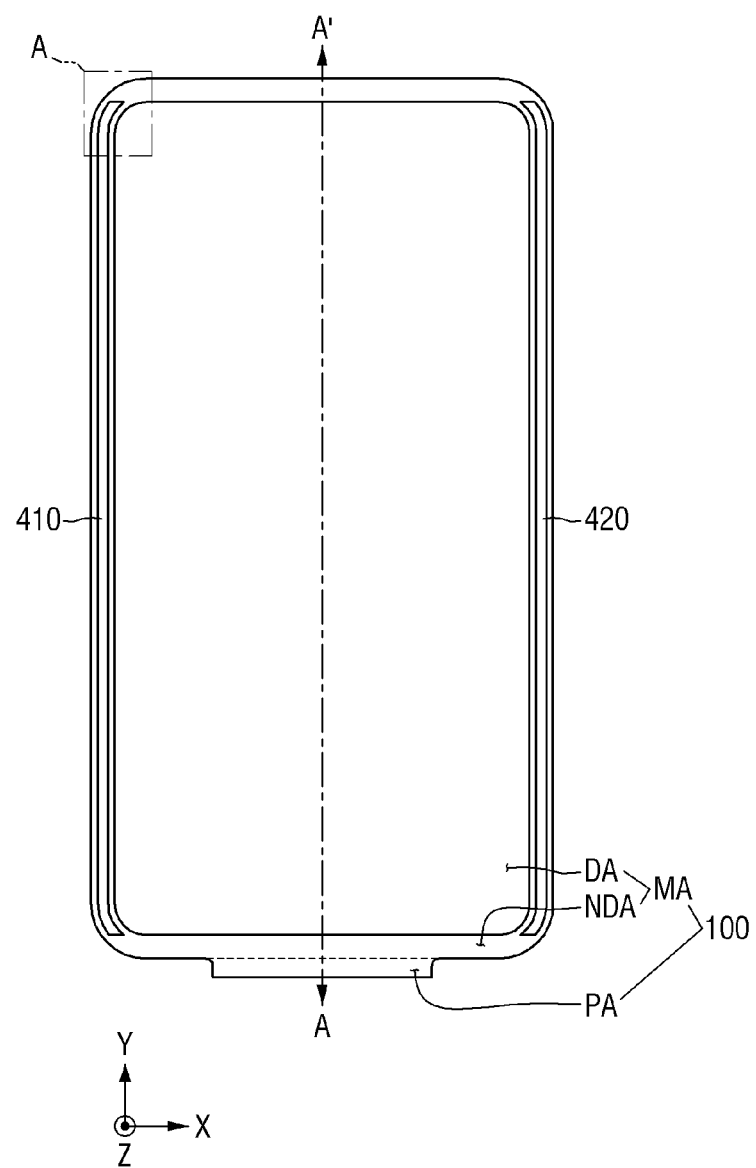
Figure 4A:
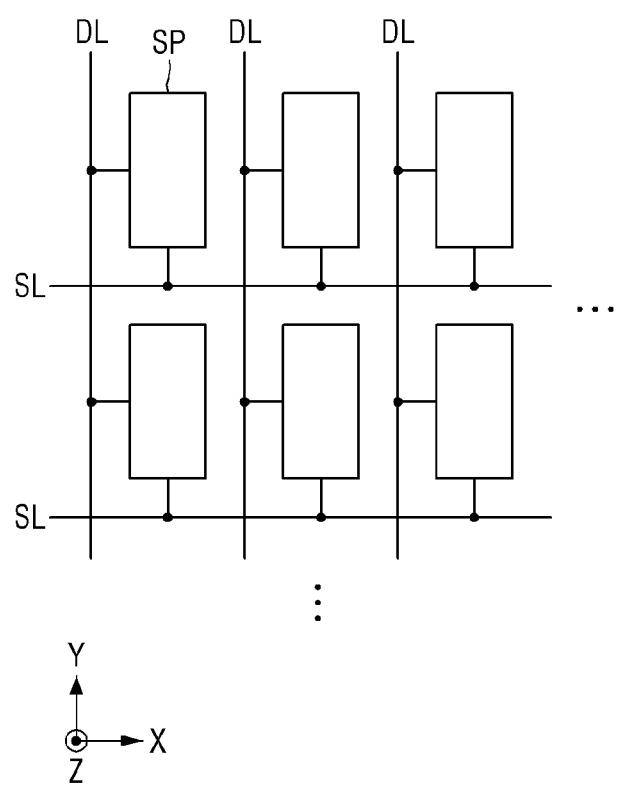
FIG. 4A is an exemplary view illustrating an example of a part of the display area of FIGS. 2 and 3.

FIGS. 2 and 3 are plan views of a display device according to an embodiment, and FIG. 4A is an exemplary view illustrating an example of a part of the display area of FIGS. 2 and 3.

It is illustrated in FIG. 2 that the sub-area SBA is unfolded without being bent. It is illustrated in FIG. 3 that the sub-area SBA is bent.

Referring to FIGS. 2 and 3, the display panel 100 may include a main area MA and a sub-area SBA.

The main area MA may include a display area DA displaying an image, and a non-display area NDA which is a peripheral area of the display area DA. The display area DA may occupy most of the main area MA. The display area DA may be disposed at the center of the main area MA.

The display area DA may include scan lines SL extending in the first direction (i.e., X-axis direction), data lines DL extending in the second direction (i.e., Y-axis direction), and sub-pixels SP connected to the scan lines SL and the data lines DL. Each of the sub-pixels SP may be connected to the scan line SL and the data line DL. Each of the sub-pixels SP may receive a data voltage from the data line DL when a scan signal is applied to the scan line SL. Each of the sub-pixels SP may emit light according to the data voltage.

The non-display area NDA may be disposed adjacent to the display area DA. The non-display area NDA may be an area outside the display area DA. The non-display area NDA may be disposed to surround the display area DA. The non-display area NDA may be an edge area of the display panel 100.

The sub-area SBA may protrude from one side of the main area MA in the second direction (i.e., Y-axis direction). The length of the sub-area SBA in the second direction (i.e., Y-axis direction) may be smaller than the length of the main area MA in the second direction (i.e., Y-axis direction). The length of the sub-area SBA in the first direction (i.e., X-axis direction) may be smaller than the length of the main area MA in the first direction (i.e., X-axis direction), or may be substantially the same as the length of the main area MA in the first direction (i.e., X-axis direction). The sub-area SBA may be bent, and may be disposed on the rear surface of the display panel 100. In this case, the sub-area SBA may overlap the main area MA in the third direction (i.e., Z-axis direction).

The sub-area SBA may include a protrusion area PA, a pad area PDA, and a bending area BA.

The protruding area PA is an area protruding from one side of the main area MA in the second direction (i.e., Y-axis direction). One side of the protrusion area PA may contact the non-display area NDA of the main area MA, and the other side of the protrusion area PA may contact the bending area BA.

The pad area PDA is an area in which pads PD and the display driving circuit 200 are arranged. The display driving circuit 200 may be attached to the driving pads of the pad area PDA by using a low-resistance and high-reliability material such as an anisotropic conductive film or self-assembly anisotropic conductive paste ("SAP"). The circuit board 300 may be attached to the pads PD of the pad area PDA using a low-resistance, high-reliability material such as an anisotropic conductive film or SAP. One side of the pad area PDA may contact the bending area BA.

The bending area BA is an area where the display panel 100 is bent. When the bending area BA is bent, the pad area PDA may be disposed under the protrusion area PA and under the main area MA. The bending area BA may be disposed between the protrusion area PA and the pad area PDA. One side of the bending area BA may contact the protrusion area PA, and the other side of the bending area BA may contact the pad area PDA.

Further, the display panel 100 may include a first scan driver 410 and a second scan driver 420. The first scan driver 410 and the second scan driver 420 may be disposed in the non-display area NDA. The first scan driver 410 may be disposed outside the left side of the display area DA, and the second scan driver 420 may be disposed outside the right side of the display area DA. Although it is illustrated in FIGS. 2 and 3 that the display panel 100 includes two scan drivers 410 and 420, the present invention is not limited thereto. The display panel 100 may include one scan driver, and in this case, any one of the first scan driver 410 and the second scan driver 420 may be omitted.

Each of the first scan driver 410 and the second scan driver 420 may be connected to the scan lines SL of the display area DA. The scan lines SL may include initialization scan lines, write scan lines, bias scan lines, and light emitting lines.

Each of the first scan driver 410 and the second scan driver 420 may receive a scan timing signal of the display driving circuit 200 through scan fan-out lines connected to the display driving circuit 200. Each of the first scan driver 410 and the second scan driver 420 may generate initialization scan signals, write scan signals, and bias scan signals according to the scan timing signal. Each of the first scan driver 410 and the second scan driver 420 may output initialization scan lines, write scan lines, and bias scan lines to the initialization scan lines, write scan lines, and bias scan lines of the scan lines SL in the display area DA.

Each of the first scan driver 410 and the second scan driver 420 may receive a light emission timing signal from the display driving circuit 200 through light emission fan-out lines connected to the display driving circuit 200. Each of the first scan driver 410 and the second scan driver 420 may generate light emission signals according to the light emission timing signal. Each of the first scan driver 410 and the second scan driver 420 may output the light emission signals to the light emission lines of the scan lines SL of the display area DA.

The display driving circuit 200 may be connected to the data lines DL of the display area DA. The display driving circuit 200 may be connected to the pads PD to receive digital video data from the circuit board 300. The display driving circuit 200 may convert digital video data into analog data voltages and output the analog data voltages to the data lines DL.

Figure 4B:
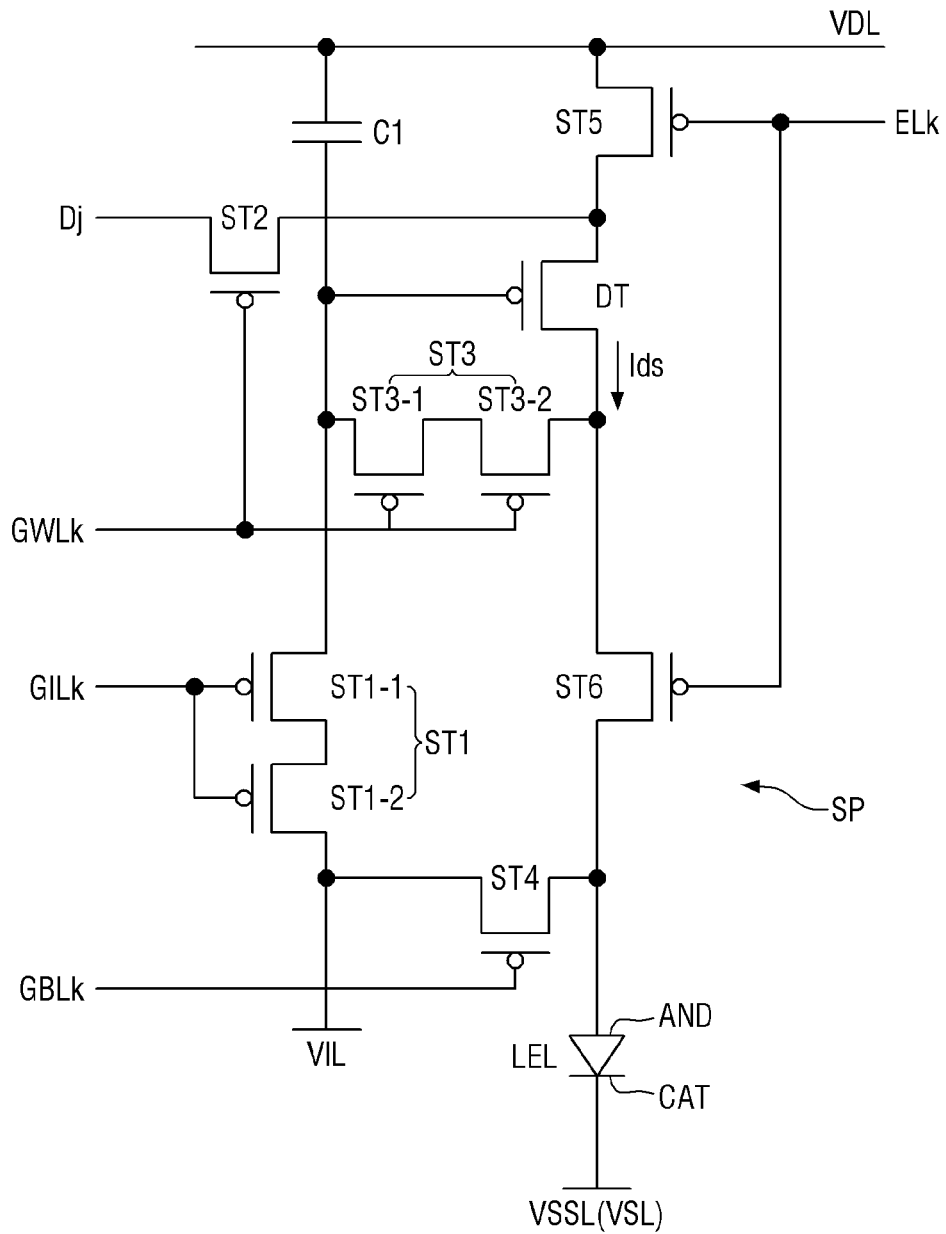
FIG. 4B is a circuit diagram illustrating an example of the sub-pixel of FIG. 4A.

FIG. 4B is a circuit diagram illustrating an example of the sub-pixel of FIG. 4A.

Referring to FIG. 4B, the scan line SL of FIG. 4A may include a k-th (k is a positive integer) initialization scan line GILk, a k-th write scan line GWLk, and a k-th bias scan line GBLk, and a k-th light emitting line ELk. In this case, the sub-pixel SP may be connected to the k-th (k is a positive integer) initialization scan line GILk, the k-th write scan line GWLk, and the k-th bias scan line GBLk.

Further, the sub-pixel SP may be connected to a driving voltage line VSL to which a driving voltage is applied, an initialization voltage line VIL to which an initialization voltage is supplied, and a high-potential driving voltage line VDL to which a high-potential driving voltage is supplied. The driving voltage may be a voltage lower than the high-potential driving voltage.

The sub-pixel SP according to an embodiment includes a driving transistor DT, a light emitting element LEL, switch elements, and a capacitor C. Although it is illustrated in FIG. 4B that the switch elements include first to sixth transistors ST1, ST2, ST3, ST4, ST5, and ST6, the number of switch elements in the sub-pixel SP is not limited thereto.

The driving transistor DT may include a gate electrode, a first electrode, and a second electrode. The driving transistor DT controls a drain-source current Ids (hereinafter referred to as "driving current") flowing between the first electrode and the second electrode according to the data voltage applied to the gate electrode. The driving current Ids flowing through the channel of the driving transistor DT is proportional to a square of a difference between a gate-source voltage Vsg and a threshold voltage Vth of the driving transistor DT as shown in Equation 1 below.

$$Ids = k' \times (Vgs - Vth)^2 \qquad \text{[Equation 1]}$$

In Equation 1, k' is a proportional coefficient determined by the structure and physical characteristics of the driving transistor DT, Vgs is a gate-source voltage of the driving transistor DT, and Vth is a threshold voltage of driving transistor DT.

The light emitting element LEL emits light in accordance with the driving current Ids. The light emission amount of the light emitting element LEL may be proportional to the drive current Ids.

The light emitting element LEL may be an organic light emitting diode including an anode electrode, a cathode electrode, and an organic light emitting layer disposed between the anode electrode and the cathode electrode. Alternatively, the light emitting element LEL may be an inorganic light emitting element including an anode electrode, a cathode electrode, and an inorganic semiconductor disposed between the anode electrode and the cathode electrode. Alternatively, the light emitting element LEL may be a quantum dot light emitting element including an anode electrode, a cathode electrode, and a quantum dot light emitting layer disposed between the anode electrode and the cathode electrode. Alternatively, the light emitting element LEL may be a micro light emitting diode.

The anode electrode AND of the light emitting element LEL may be connected to the first electrode of the fourth transistor ST4 and the second electrode of the sixth transistor ST6, and the cathode electrode CAT of the light emitting element LEL may be connected to the second driving voltage line VSSL. A parasitic capacitance Cel may be formed between the anode electrode and cathode electrode of the light emitting element LEL.

The first transistor ST1 may be a dual transistor including a first-first transistor ST1-1 and a first-second transistor ST1-2. The first-first transistor ST1-1 and the first-second transistor ST1-2 are turned on by the initialization scan signal of the k-th initialization scan line GILk to connect the gate electrode of the driving transistor DT and the initialization voltage line VIL. The gate electrode of the driving transistor DT may be discharged to the initialization voltage of the initialization voltage line VIL. The gate electrode of the 1-1th transistor ST1-1 may be connected to the k-th initialization scan line GILk, the first electrode thereof may be connected to the gate electrode of the driving transistor DT, and the second electrode thereof may be connected to the first electrode of the first-second transistor ST1-2. The gate electrode of the first-second transistor ST1-2 may be connected to the k-th initialization scan line GILk, the first electrode thereof may be connected to the second electrode of the first-first transistor ST1-1, and the second electrode thereof may be connected to the initialization voltage line VIL.

The second transistor ST2 is turned on by the write scan signal of the k-th write scan line GWLk to connect the first electrode of the driving transistor DT to the j-th data line Dj. The gate electrode of the second transistor ST2 may be connected to the k-th write scan line GWLk, the first electrode thereof may be connected to the first electrode of the driving transistor DT, and the second electrode thereof may be connected to the j-th data line D.

The third transistor ST3 may be a dual transistor including a third-first transistor ST3-1 and a third-second transistor ST3-2. The third-first transistor ST3-1 and the third-second transistor ST3-2 are turned on by the write scan signal of the k-th write scan line GWLk to connect the gate electrode and second electrode of the driving transistor DT. That is, when the third-first transistor ST3-1 and the third-second transistor ST3-2 are turned on, the gate electrode and second electrode of the driving transistor DT are connected to each other, the driving transistor DT is driven as a diode. The gate electrode of the third-first transistor ST3-1 may be connected to the k-th write scan line GWLk, the first electrode thereof may be connected to the second electrode of the third-second transistor ST3-2, and the second electrode thereof may be connected to the gate electrode of the driving transistor DT. The gate electrode of the third-second transistor ST3-2 may be connected to the k-th write scan line GWLk, the first electrode thereof may be connected to the second electrode of the driving transistor DT, and the second electrode thereof may be connected to the first electrode of the third-first transistor ST3-1.

The fourth transistor ST4 is turned on by the bias scan signal of the k-th bias scan line GBLk to connect the anode electrode AND of the light emitting element LEL to the initialization voltage line VIL. The anode electrode of the light emitting element LEL may be discharged to an initialization voltage of the initialization voltage line VIL. The gate electrode of the fourth transistor ST4 may be connected to the k-th bias scan line GBLk, the first electrode thereof may be connected to the anode electrode AND of the light emitting element LEL, and the second electrode thereof may be connected to the initialization voltage line VIL.

The fifth transistor ST5 is turned on by the light emission control signal of the k-th light emitting line ELk to connect the first electrode of the driving transistor DT to the high-potential driving voltage line VDL. The gate electrode of the fifth transistor ST5 is connected to the k-th light emitting line ELk, the first electrode thereof is connected to the high-potential driving voltage line VDL, and the second electrode thereof is connected to the source electrode of the driving transistor DT.

The sixth transistor ST6 is connected between the second electrode of the driving transistor DT and the anode electrode of the light emitting element LEL. The sixth transistor ST6 is turned on by the light emission control signal of the k-th light emitting line ELk to connect the second electrode of the driving transistor DT to the anode electrode of the light emitting element LEL. The gate electrode of the sixth transistor ST6 is connected to the k-th light emitting line ELk, the first electrode thereof is connected to the second electrode of the driving transistor DT, and the second electrode thereof is connected to the anode electrode of the light emitting element LEL. When both the fifth transistor ST5 and the sixth transistor ST6 are turned on, the driving current Ids may be supplied to the light emitting element LEL.

The capacitor C1 is formed between the gate electrode of the driving transistor DT and the high-potential driving voltage line VDL. One electrode of the capacitor C may be connected to the second electrode of the driving transistor DT, and the other electrode thereof may be connected to the high-potential driving voltage line VDL.

When the first electrode of each of the first to sixth transistors ST1, ST2, ST3, ST4, ST5, and ST6 and the driving transistor DT is a source electrode, the second electrode thereof may be a drain electrode. Alternatively, when the first electrode of each of the first to sixth transistors ST1, ST2, ST3, ST4, ST5, and ST6 and the driving transistor DT is a drain electrode, the second electrode thereof may be a source electrode.

The active layer of each of the first to sixth transistors ST1, ST2, ST3, ST4, ST5, and ST6 and the driving transistor DT may be formed of or include any one of polysilicon, amorphous silicon, and an oxide semiconductor. Although it is mainly described in FIG. 4B that the first to sixth transistors ST1, ST2, ST3, ST4, ST5, and ST6 and the driving transistor DT are P-type metal oxide semiconductor field effect transistors ("MOSFETs"), the present invention is not limited thereto, and they may be N-type MOSFETs.

Figure 5:
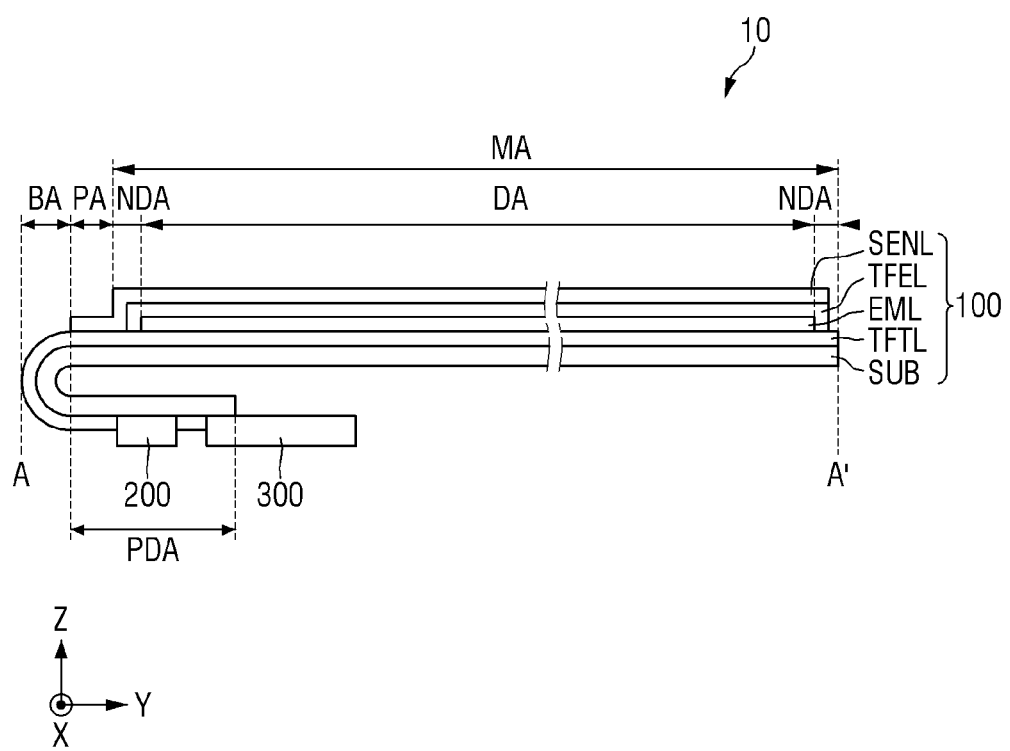
FIG. 5 is a side view of a display device according to an embodiment.

It should be noted that the circuit diagram of the sub-pixel SP according to an embodiment is not limited to the configuration shown in FIG. 4B. FIG. 5 is a side view of a display device according to an embodiment.

FIG. 5 illustrates an example of the display device 10 taken along line A-A' of FIG. 3.

Referring to FIG. 5, the display panel 100 may include a substrate SUB, a thin film transistor layer TFTL, a light emitting element layer EML, a thin film encapsulation layer TFEL, and a sensor electrode layer SENL.

The thin film transistor layer TFTL may be disposed on the substrate SUB. The thin film transistor layer TFTL may be disposed in the main area MA and the sub-area SBA. The thin film transistor layer TFTL may include pixel transistors, scan driving transistors, scan lines, data lines, a driving voltage line VSL, a first scan driver 410, and a second scan driver 420.

The light emitting element layer EML may be disposed on the thin film transistor layer TFTL. The light emitting element layer EML may be disposed in the display area DA of the main area MA. The light emitting element layer EML may include light emitting elements arranged in the light emitting areas.

The thin film encapsulation layer TFEL may be disposed on the light emitting element layer EML. The thin film encapsulation layer TFEL may be disposed in the display area DA and non-display area NDA of the main area MA. The thin film encapsulation layer TFEL may include at least one inorganic layer and at least one organic layer for encapsulating the light emitting element layer EML.

The sensor electrode layer SENL may be disposed on the thin film encapsulation layer TFEL. The sensor electrode layer SENL may be disposed in the main area MA and the protrusion area PA of the sub-area SBA. The sensor electrode layer SENL may be disposed in the bending area BA and pad area PDA of the sub-area SBA. The sensor electrode layer SENL may sense a touch of a person or an object using sensor electrodes.

In order to prevent a decrease in visibility of a person seeing the display panel 100 by reflecting external light from lines and electrodes of the display panel 100, a polarization film may be disposed on the sensor electrode layer SENL. The polarization film may include a first base member, a phase retardation film such as a linear polarizing plate, a quarter-wave plate and/or a half-wave plate, and a second base member.

A cover window may be disposed on the polarization film to protect the upper portion of the display panel 100. The cover window may be attached onto the polarization film by a transparent adhesive member such as an optically clear adhesive ("OCA") film or an optically clear resin ("OCR") film. The cover window may include an inorganic material such as glass, or an organic material such as plastic or polymer material.

Figure 6:
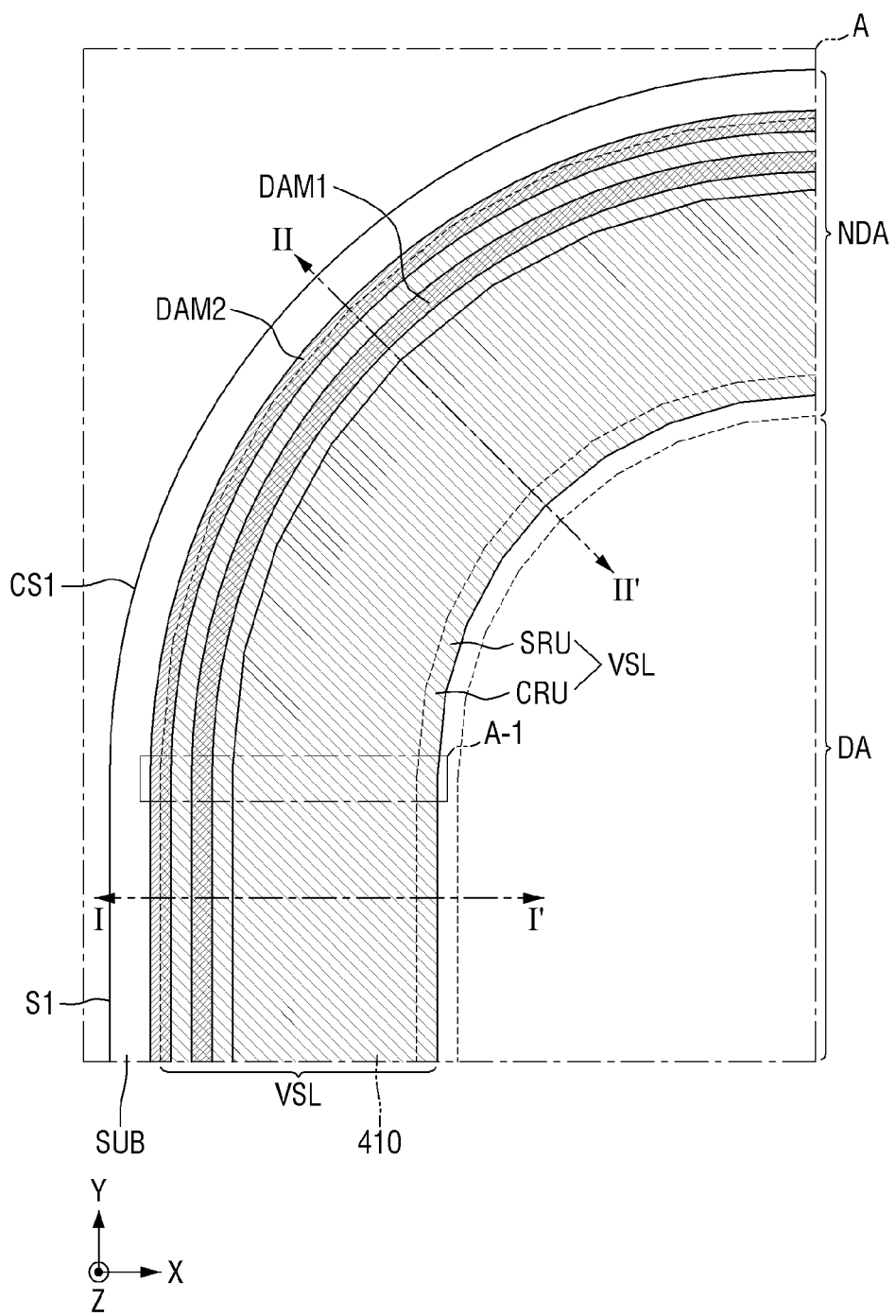
FIG. 6 is a layout view illustrating a non-display area of a first side and a first corner of a display panel according to an embodiment.

FIG. 6 is a layout view illustrating a non-display area of a first side and a first corner of a display panel according to an embodiment.

FIG. 6 illustrates an example of area A of FIGS. 2 and 3. FIG. 6 illustrates a part of the display area DA and a part of the non-display area NDA at the first side and first corner of the display panel 100. For convenience of explanation, FIG. 6 illustrates only the substrate SUB, driving voltage line VSL, first scan driver 410, first dam DAM1 and second dam DAM2 of the non-display area NDA.

Referring to FIG. 6, the driving voltage line VSL may include at least one straight portion SRU and at least one bent portion CRU. For example, the driving voltage line VSL may include a plurality of straight portions SRU and a plurality of bent portions CRU. The straight portion SRU indicates a region where the driving voltage line VSL is formed straight in a straight line. The bent portion CRU indicates a region where the driving voltage line VSL is bent or curved. The bent portion CRU may be disposed between the straight portions SRU adjacent to each other in the longitudinal direction of the driving voltage line VSL. The driving voltage line VSL may be bent or curved at a predetermined angle in the bent portion CRU.

Figure 7:
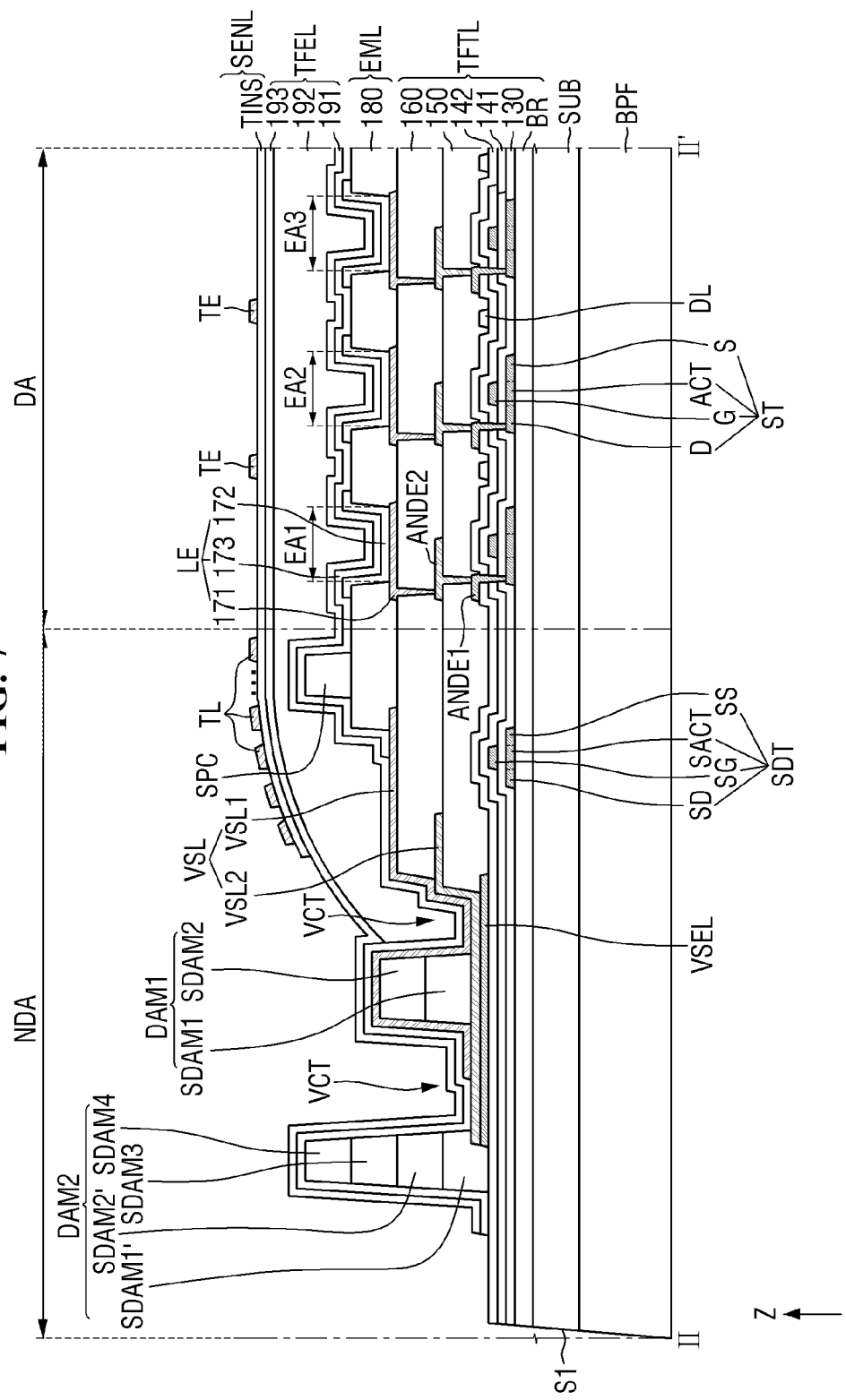
FIG. 7 is a cross-sectional view illustrating an example of the display panel taken along line II-II' of FIG. 6.

Although it is illustrated in FIGS. 6 and 7 that the first side S1 is a left longitudinal side of the substrate SUB, and the first corner CS1 is a corner disposed at the left upper edge of the substrate SUB, the present invention is not limited thereto. In another embodiment, the first side S1 may be a right longitudinal side of the substrate SUB, and the first corner CS1 may be a corner disposed at the left lower edge, right upper edge or right lower edge of the substrate SUB.

The driving voltage line VSL may be disposed straight along the first side S1 of the substrate SUB when viewed on a plane (i.e., in a plan view). That is, the driving voltage line VSL may include a straight portion SRU on the first side S1 of the substrate SUB.

The driving voltage line VSL may be bent or curved a plurality of times at a predetermined angle at the first corner CS1 when viewed on a plane (i.e., in a plan view). That is, the driving voltage line VSL may be formed by a combination of a plurality of bent portions CRU and a plurality of straight portions SRU at the first corner CS1 of the substrate SUB.

The driving voltage line VSL may be disposed between the edge of the substrate SUB and the display area DA. The driving voltage line VSL may be connected to the driving connection line (VSEL of FIG. 7) through a driving connection contact hole (VCT of FIG. 7) disposed around the first dam DAM1. Accordingly, the driving voltage line VSL may receive a driving voltage corresponding to a low-potential driving voltage through the driving connection line (VSEL of FIG. 7). The low-potential driving voltage may be a voltage lower than the high-potential driving voltage applied to the high-potential driving voltage line VDL shown in FIG. 4B. The driving connection contact hole (VCT of FIG. 7) may be disposed inside and outside the first dam DAM1. The driving connection contact hole (VCT of FIG. 7) may extend along the longitudinal direction of the first dam DAM1. As used herein, part A is disposed outside part B means that the part A is disposed farther than the part B from the display area DA, and part A is disposed inside part B means that the part A is disposed closer than the part B from the display area DA.

The driving voltage line VSL may be a line electrically connected to the cathode electrode CAT of the light emitting elements LEL of the sub-pixels SP, as shown in FIG. 4B, but the present invention is not limited thereto. In another embodiment, the driving voltage line VSL may be a high-potential driving voltage line VDL or an initialization voltage line VIL shown in FIG. 4B. Alternatively, the driving voltage line VSL may be a voltage line to which a different voltage is applied, other than the voltage line shown in FIG. 4B.

The first scan driver 410 may overlap the driving voltage line VSL in the third direction (i.e., Z-axis direction). The first scan driver 410 may extend from the first side S1 of the substrate SUB in the second direction (i.e., Y-axis direction). The first scan driver 410 may be bent or curved a plurality of times at a predetermined angle when viewed from the first corner CS1 of the substrate SUB on a plane (i.e., in a plan view). Since the first scan driver 410 is disposed under the driving voltage line VSL, the first scan driver 410 is covered by the driving voltage line VSL not to be seen, and thus is shown as a dotted line in FIG. 6. The first scan driver 410 may be disposed between the first dam DAM1 and the display area DA.

The first dam DAM1 and the second dam DAM2 are structures for preventing the organic layer of the encapsulation layer from overflowing, and may extend along the first side S1 and corner CS1 of the substrate SUB. The second dam DAM2 may be disposed outside the first dam DAM1. The first and second dams DAM1 and DAM2 may overlap the driving voltage line VSL in the third direction (i.e., Z-axis direction). FIG. 7 is a cross-sectional view illustrating an example of the display panel taken along line II-II' of FIG. 6.

Referring to FIG. 7, the display panel 100 includes a lower protective film BPF, a substrate SUB, a thin film transistor layer TFTL, a light emitting element layer EML, an encapsulation layer TFEL, and a sensor electrode layer SENL.

The lower protective film BPF may be made of an insulating material such as polyimide ("PI") or polyethylene terephthalate ("PET"). The substrate SUB may be disposed on the lower protective film BPF. The substrate SUB may be made of an insulating material such as glass or plastic. For example, the substrate SUB may include polyimide. In this case, the substrate SUB may be a flexible substrate capable of bending, folding, rolling, or the like.

The thin film transistor layer TFTL including pixel transistors ST and scan transistors SDT may be disposed on the substrate SUB.

Each of the sub-pixels (SP in FIG. 4A) includes at least one pixel transistor ST and a light emitting element LE. The at least one pixel transistor ST may be a transistor for driving the light emitting element LE.

The first scan driver 410 includes at least one scan transistor SDT. The scan transistor SDT may be a transistor for outputting scan signals by being electrically connected to scan lines (SL in FIG. 4A) of the display area DA.

The thin film transistor layer TFTL may include a pixel transistor ST, a scan transistor SDT, a barrier layer BR, a gate insulating layer 130, a first interlayer-insulating layer 141, a second interlayer-insulating layer 142, a first planarization layer 150, and a second planarization layer 160.

The barrier layer BR may be disposed on the substrate SUB. The barrier layer BR may be formed of or include a silicon nitride layer, a silicon oxy nitride layer, a silicon oxide layer, a titanium oxide layer, or an aluminum oxide layer.

The pixel transistor ST and the scan transistor SDT may be disposed on the barrier layer BR. The pixel transistor ST may be the fourth transistor ST4 or the sixth transistor ST6 shown in FIG. 4B. The pixel transistor ST may include a pixel active layer ACT, a gate electrode G, a source electrode S, and a drain electrode D. The scan transistor SDT may include a scan active layer SACT, a scan gate electrode SG, a scan source electrode SS, and a scan drain electrode SD.

The active layer ACT, source electrode S and drain electrode D of the pixel transistor ST, and the scan active layer SACT, scan source electrode SS and scan drain electrode SD of the scan transistor SDT may be disposed on the barrier layer BR. Each of the active layer ACT and the scan active layer SACT may include a silicon semiconductor such as polycrystalline silicon, single crystal silicon, low-temperature polycrystalline silicon, or amorphous silicon.

The active layer ACT overlapping the gate electrode G in the third direction (i.e., Z-axis direction) may be defined as a channel region of the pixel transistor ST. The source electrode S and drain electrode D not overlapping the gate electrode G in the third direction (i.e., Z-axis direction) may have conductivity by doping a silicon semiconductor or an oxide semiconductor with impurities or ions.

The scan active layer SACT overlapping the scan gate electrode SG in the third direction (i.e., Z-axis direction) may be defined as a channel region of the scan transistor SDT. The scan source electrode SS and scan drain electrode SD not overlapping the scan gate electrode SG in the third direction (i.e., Z-axis direction) may have conductivity by doping a silicon semiconductor or an oxide semiconductor with impurities or ions The gate insulating layer 130 may be disposed on the active layer ACT, source electrode S and drain electrode D of the pixel transistor ST, and the scan active layer SACT, scan source electrode SS and scan drain electrode SD of the scan transistor SDT. The gate insulating layer 130 may be formed of or include an inorganic layer, for example, a silicon nitride layer, a silicon oxy nitride layer, a silicon oxide layer, a titanium oxide layer, or an aluminum oxide layer.

The gate electrode G of the pixel transistor ST and the scan gate electrode SG of the scan transistor SDT may be disposed on the gate insulating layer 130. The gate electrode G of the pixel transistor ST may overlap the active layer ACT in the third direction (i.e., Z-axis direction). The scan gate electrode SG of the scan transistor SDT may overlap the scan active layer SACT in the third direction (i.e., Z-axis direction). The gate electrode G and the scan gate electrode SG may be a single layer or multiple layers including any one of molybdenum (Mo), aluminum (Al), chromium (Cr), gold (Au), titanium (Ti), nickel (Ni), neodymium (Nd), and copper (Cu), or an alloy thereof.

The first interlayer-insulating layer 141 may be disposed on the gate electrode G and the scan gate electrode SG. The first interlayer-insulating layer 141 may be an inorganic layer, for example, a silicon nitride layer, a silicon oxy nitride layer, a silicon oxide layer, a titanium oxide layer, or an aluminum oxide layer. The first interlayer-insulating layer 141 may include a plurality of inorganic layers.

The second interlayer-insulating layer 142 may be disposed on the first interlayer-insulating layer 141. The second interlayer-insulating layer 142 may be an inorganic layer, for example, a silicon nitride layer, a silicon oxy nitride layer, a silicon oxide layer, a titanium oxide layer, or an aluminum oxide layer.

A first anode connection electrode ANDE1, a data line DL, and a driving connection line VSEL may be disposed on the second interlayer-insulating layer 142. The first anode connection electrode ANDE1 may be connected to a conductive region disposed on the other side of the active layer ACT through a contact hole penetrating the gate insulating layer 130, the first interlayer-insulating layer 141, and the second interlayer-insulating layer 142. The data line DL may be connected to the source electrode or drain electrode of the second transistor ST2 shown in FIG. 4B through a contact hole penetrating the first interlayer-insulating layer 141 and the second interlayer-insulating layer 142. The first anode connection electrode ANDE1, the data line DL, and the driving connection line VSEL may be a single layer or multiple layers including any one of molybdenum (Mo), aluminum (Al), chromium (Cr), gold (Au), titanium (Ti), nickel (Ni), neodymium (Nd), and copper (Cu), or an alloy thereof.

The first planarization layer 150 may be disposed on the first anode connection electrode ANDE1, the data line DL, and the driving connection line VSEL to flatten a step due to the thin film transistors. The first planarization layer 150 may be formed of or include an organic layer including an acrylic resin, an epoxy resin, a phenolic resin, a polyamide resin, or a polyimide resin.

A second anode connection electrode ANDE2 and a second driving voltage line VSL2 of the driving voltage line VSL may be disposed on the first planarization layer 150. The second anode connection electrode ANDE2 may be connected to the source electrode S or drain electrode D of the pixel transistor ST through a contact hole penetrating the first planarization layer 150. The second driving voltage line VSL2 may overlap the scan transistor SDT in the third direction (i.e., Z-axis direction). The second anode connection electrode ANDE2 and the second driving voltage line VSL2 may be single layer or multiple layers including any one of molybdenum (Mo), aluminum (Al), chromium (Cr), gold (Au), titanium (Ti), nickel (Ni), neodymium (Nd), and copper (Cu), or an alloy thereof.

The second planarization layer 160 may be disposed on the second anode connection electrode ANDE2 and the driving voltage line VSL. The second planarization layer 160 may be formed of or include an organic layer including an acrylic resin, an epoxy resin, a phenolic resin, a polyamide resin, or a polyimide resin.

The light emitting element layer EML is disposed on the thin film transistor layer TFTL. The light emitting element layer EML may include light emitting elements LE and a bank 180.

Each of the light emitting elements LE may include a pixel electrode 171, a light emitting layer 172, and a common electrode 173. Each of the light emitting areas EA1, EA2, and EA3 refers to an area where the pixel electrode 171, the light emitting layer 172, and the common electrode 173 are sequentially stacked, and thus holes from the pixel electrode 171 and electrons from the common electrode 173 are combined with each other in the light emitting layer 172 to emit light. In this case, the pixel electrode 171 may be an anode electrode, and the common electrode 173 may be a cathode electrode.

The pixel electrode 171 may be disposed on the second planarization layer 160. The pixel electrode 171 may be connected to the second anode connection electrode ANDE2 through a contact hole penetrating the second planarization layer 160.

In a top emission structure in which light is emitted from the light emitting layer 172 toward the common electrode 173, the pixel electrode 171 may be a single layer of molybdenum (Mo), titanium (Ti), copper (Cu), or aluminum (Al), or may be formed as a laminated structure (Ti/Al/Ti) of aluminum and titanium, a laminated structure ("ITO"/Al/"ITO") of aluminum and ITO, an Ag—Pd—Cu ("APC") alloy, or a laminated structure (ITO/APC/ITO) of an APC alloy and ITO. The APC alloy refers to an alloy of silver (Ag), palladium (Pd), and copper (Cu).

The bank 180 serves to define the light emitting areas EA1, EA2, and EA3 of the display pixels. For this purpose, the bank 180 may be formed to expose a part of the pixel electrode 171 on the second planarization layer 160. The bank 180 may cover the edge of the pixel electrode 171. The bank 180 may be disposed in a contact hole penetrating the second planarization layer 160. Thus, the contact hole penetrating the second planarization layer 160 may be filled by the bank 180. The bank 180 may be formed of or include an organic layer including an acrylic resin, an epoxy resin, a phenolic resin, a polyamide resin, or a polyimide resin.

The light emitting areas EA1, EA2, and EA3 may emit light of different colors. For example, the first light emitting area EA1 may emit light of a first color, the second light emitting area EA2 may emit light of a second color, and the third light emitting area EA3 may emit light of a third color. The first color may be red, the second color may be green, and the third color may be blue, but embodiments of the present specification are not limited thereto.

The light emitting layer 172 is disposed on the pixel electrode 171. The light emitting layer 172 may include an organic material and emit light of a predetermined color. For example, the light emitting layer 172 may include a host and a dopant. The organic material layer may include a material emitting predetermined light, and may be formed using or include a phosphorescent material or a fluorescent material.

Further, each of the light emitting areas EA1, EA2, and EA3 may further include an electron transporting layer between the light emitting layer 172 and the common electrode 173 and a hole transporting layer between the light emitting layer 172 and the pixel electrode 171. In this case, the electron transporting layer and the hole transporting layer may be common layers formed commonly in the display pixels.

The common electrode 173 is disposed on the light emitting layer 172. The common electrode 173 may cover the light emitting layer 172. The common electrode 173 may be a common layer formed commonly in the display pixels. A capping layer may be disposed on the common electrode 173.

In the top emission structure, the common electrode 173 may include a transparent conductive material ("TCO") such as ITO or IZO, which can transmit light, or a semi-transmissive conductive material such as magnesium (Mg), silver (Ag) or an alloy of magnesium (Mg) and silver (Ag). When the common electrode 173 includes a semi-transmissive conductive material, light emission efficiency may be increased by microcavities.

The first driving voltage line VSL1 of the driving voltage line VSL may be disposed on the second planarization layer 160. The first driving voltage line VSL1 may overlap the second driving voltage line VSL2 in the third direction (i.e., Z-axis direction). The first driving voltage line VSL1 may overlap the scan transistor SDT in the third direction (i.e., Z-axis direction).

The first driving voltage line VSL1 may be connected to the common electrode 173 in the non-display area NDA. The first driving voltage line VSL1 may connected to the second driving voltage line VSL2 through a driving connection contact hole VCT defined around the first dam DAM1, and the second driving voltage line VSL2 may be connected to the driving connection line VSEL. The driving connection contact hole VCT may be disposed inside (i.e., side toward the display area DA) and outside the first dam DAM1. The common electrode 173 may receive a driving voltage corresponding to a low-potential driving voltage through the driving connection line VSEL, the first driving voltage line VSL1, and the second driving voltage line VSL2.

A spacer SPC on which a mask for depositing the light emitting layer 172 is mounted during a manufacturing process may be disposed on the bank 180. The spacer SPC may be formed of or include an organic layer including an acrylic resin, an epoxy resin, a phenolic resin, a polyamide resin, or a polyimide resin.

The encapsulation layer TFEL may be disposed on the light emitting element layer EML. The encapsulation layer TFEL may include at least one inorganic layer to prevent oxygen or moisture from penetrating into the light emitting element layer EML. Further, the encapsulation layer TFEL may include at least one organic layer to protect the light emitting element layer EML from foreign matter (e.g., particles).

For example, the encapsulation layer TFEL includes a first encapsulation inorganic layer 191 disposed on the common electrode 173, an encapsulation organic layer 192 disposed on the first encapsulation inorganic layer 191, and a second encapsulation inorganic layer 193 disposed on the encapsulation organic layer 192. The first encapsulation inorganic layer 191 and the second encapsulation inorganic layer 193 may be multiple layers in one or more inorganic layers of a silicon nitride layer, a silicon oxy nitride layer, a silicon oxide layer, a titanium oxide layer, and an aluminum oxide layer are alternately laminated. The encapsulation organic layer 192 may formed of or include an acrylic resin, an epoxy resin, a phenolic resin, a polyamide resin, or a polyimide resin.

The sensor electrode layer SENL may be disposed on the encapsulation layer TFEL. The sensor electrode layer SENL includes a touch insulating layer TINS, and touch electrodes TE and touch lines TL disposed on the touch insulating layer TINS.

The touch insulating layer TINS may be formed of or include an inorganic layer, for example, a silicon nitride layer, a silicon oxy nitride layer, a silicon oxide layer, a titanium oxide layer, or an aluminum oxide layer.

The touch electrodes TE may be arranged in the display area DA, and the touch lines TL may be arranged in the non-display area NDA. The touch electrodes TE may overlap the bank 180 in the third direction (i.e., Z-axis direction). Therefore, the touch electrodes TE may not overlap the light emitting areas EA1, EA2, and EA3. Accordingly, light emitted from the light emitting areas EA1, EA2, and EA3 is blocked by the touch electrodes TE, thereby reducing or preventing a decrease in luminance of the light.

The touch electrodes TE may be driven in a mutual capacitance method including two types of touch electrodes, that is, driving electrodes and sensing electrodes in order to sense a user's touch. In this case, touch driving signals may be applied to the driving electrodes, and a charge change amount of a mutual capacitance formed between the driving electrodes and the sensing electrodes may be sensed through the sensing electrodes, thereby determining whether or not a touch is input.

Alternatively, the touch electrodes TE may be driven in a self-capacitance method including one type of touch electrode. In this case, touch driving signals may be applied to the touch electrodes TE, and a charge change amount of a self capacitance of the touch electrodes TE may be sensed, thereby determining whether or not a touch is input.

Since the touch lines TL and the scan transistor SDT are disposed between the display area DA and the first dam DAM1 in the non-display area NDA, any one of the touch lines TL may overlap the scan transistor SDT in the third direction (i.e., Z-axis direction). Further, the touch line TL may overlap the driving voltage line VSL in the third direction (i.e., Z-axis direction).

In order to prevent the encapsulation organic layer 192 of the encapsulation layer TFE from overflowing, the first dam DAM1 and the second dam DAM2 may be disposed at the edge of the display panel DP. The first encapsulation inorganic layer 191 and the second encapsulation inorganic layer 193 may be disposed on the first dam DAM1 and the second dam DAM2. The encapsulation organic layer 192 may be disposed on the first dam DAM1, but the encapsulation organic layer 192 may not be disposed on the second dam DAM2. Alternatively, the encapsulation organic layer 192 may be disposed on the first dam DAM1 and the second dam DAM2.

The first dam DAM1 may be disposed outside the driving voltage line VSL. The first dam DAM1 may include a first sub-dam SDAM1 formed of or including the same material as the second planarization layer 160 and a second sub-dam SDAM2 formed of or including the same material as the bank 180.

The second dam DAM2 may be disposed outside the first dam DAM1. The second dam DAM2 may be a dam for confining the encapsulation organic layer 192 beyond the first dam DAM1. The second dam DAM2 may include a first sub-dam SDAM1' formed of or including the same material as the first planarization layer 150, a second sub-dam SDAM2' formed of or including the same material as the second planarization layer 160, a third sub-dam SDAM3 formed of or including the same material as the bank 180, and a fourth sub-dam SDAM4 formed of or including the same material as the spacer SPC. The fourth sub-dam SDAM4 may be omitted. The height of the second dam DAM2 may be higher than the height of the first dam DAM1.

Figure 8:
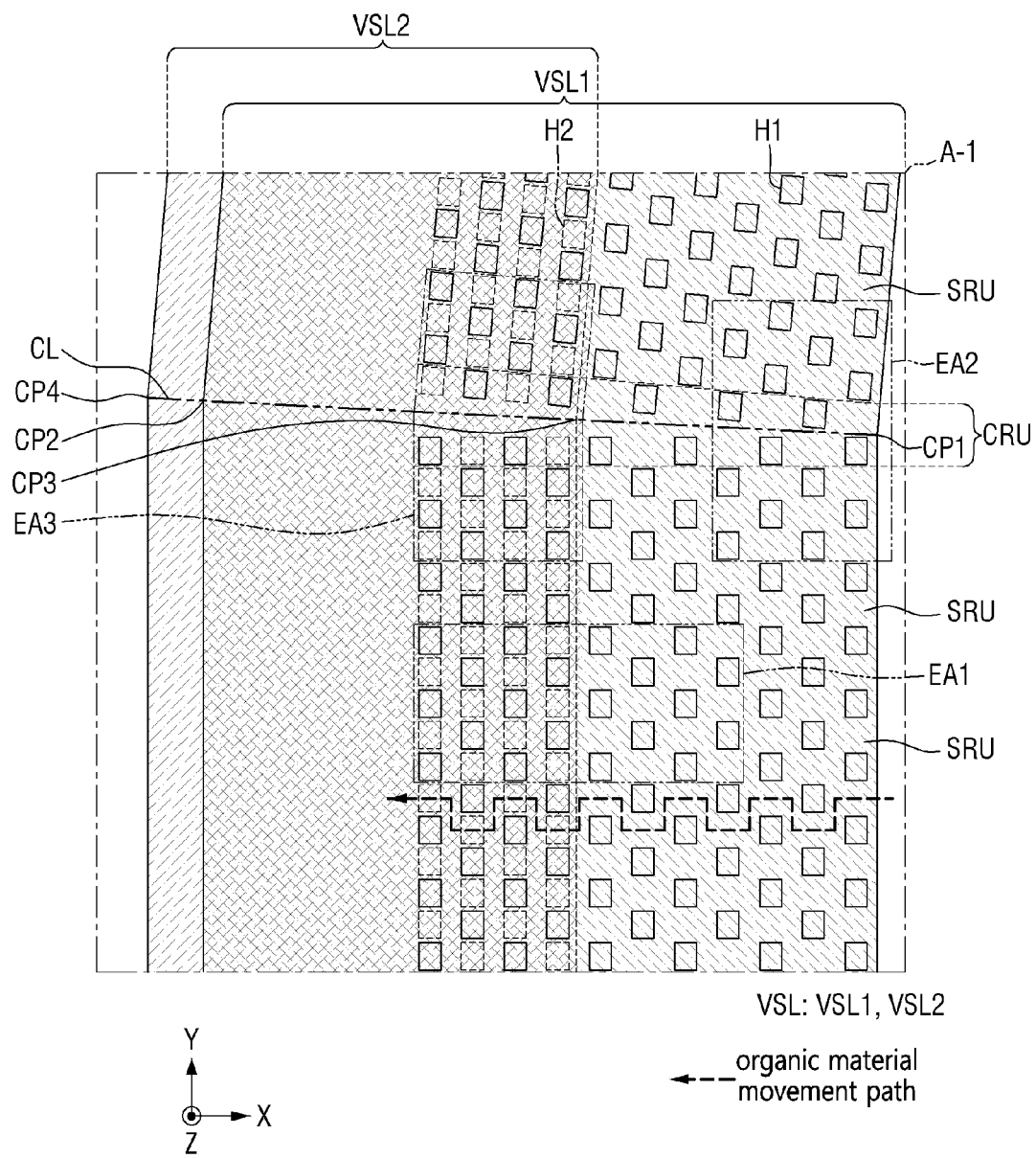
FIG. 8 is a layout view specifically illustrating an example of the driving voltage line of FIG. 6.

FIG. 8 is a layout view specifically illustrating an example of the driving voltage line of FIG. 6. FIG. 8 illustrates an example of the area A-1 of FIG. 6. FIG. 8 illustrates straight portions SRUs and bent portions CRU of the driving voltage line VSL disposed at the first corner CS1 of the display panel 100. In FIG. 8, the first dam DAM1 and the second dam DAM2 are omitted for convenience of description.

Referring to FIG. 8, the driving voltage line VSL may include a plurality of straight portions SRU and a plurality of bent portions CRU. The plurality of straight portions SRU and the plurality of bent portions CRU may be alternately arranged along the longitudinal direction of the driving voltage line VSL. The plurality of straight portions SRUs and the plurality of bent portions CRUs may be formed substantially the same as those illustrated in FIG. 8.

The point that is bent or curved at an inner side of the first driving voltage line VSL1 may be defined as a first bent point CP1, and the point that is bent or curved at an outer side of the first driving voltage line VSL1 may be defined as a second bent point CP2. In this case, the line connecting the first bent point CP1 and the second bent point CP2 may be defined as a bent line CL. The first driving voltage line VSL1 may be bent or curved along the bent line CL.

The point that is bent or curved at an inner side of the second driving voltage line VSL2 may be defined as a third bent point CP3, and the point that is bent or curved at an outer side the second driving voltage line VSL2 may be defined as a fourth bent point CP4. In this case, the line connecting the third bent point CP3 and the fourth bent point CP4 may be defined as the bent line CL, but the present invention is not limited thereto. In another embodiment, for example, the line connecting the third bent point CP3 and the fourth bent point CP4 may be another bent line different from the bent line CL. The second driving voltage line VSL2 may be bent or curved along the bent line CL or another bent line.

Figure 16:
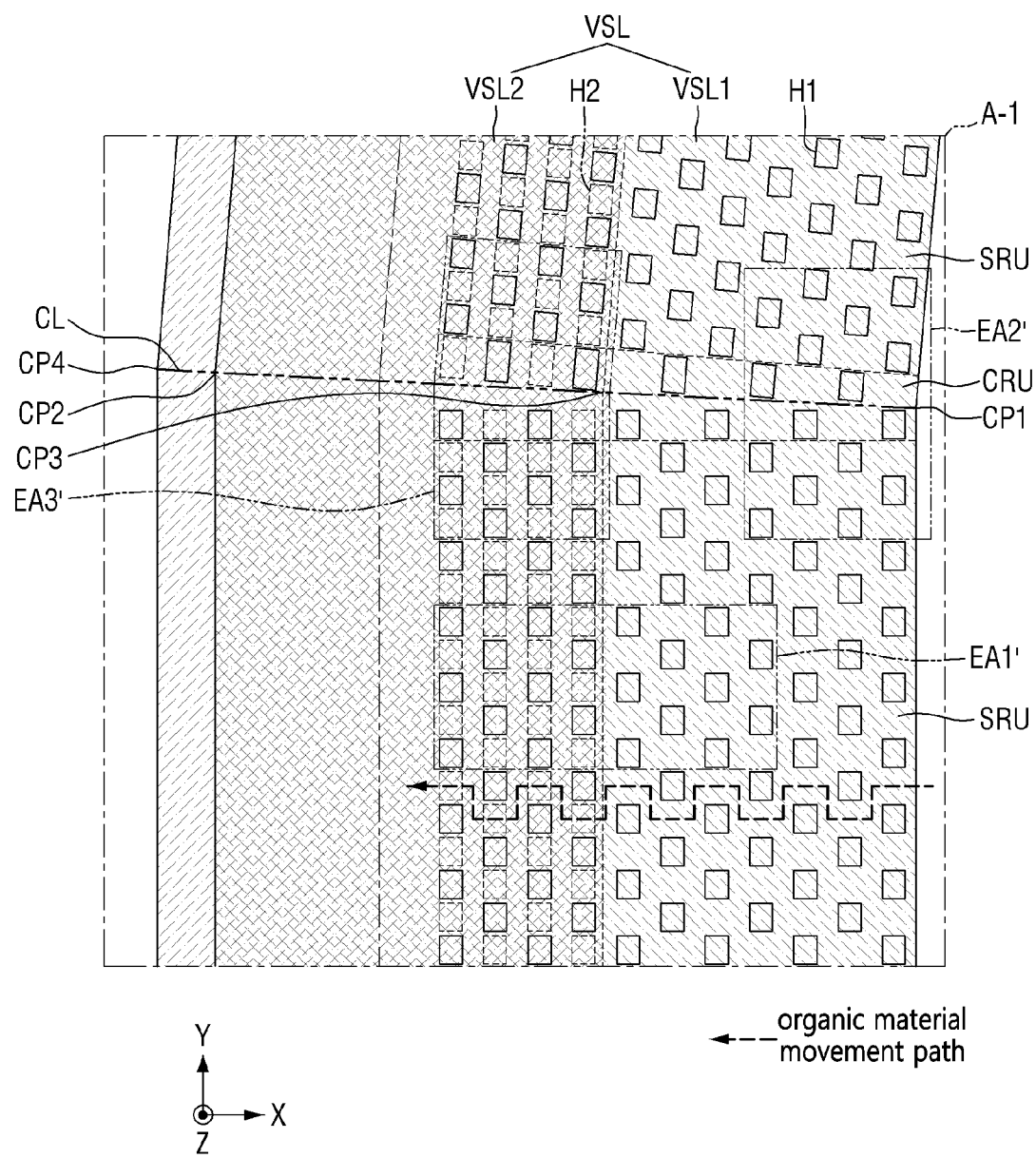
FIG. 16 is a layout view specifically illustrating another example of the driving voltage line of FIG. 6.

The bent portion CRU may be defined as a region in which first holes H1 and second holes H2 adjacent to or overlapping the bent line CL are arranged. For example, as shown in FIGS. 8 and 16, the bent portion CRU may include first holes H1 and second holes H2 arranged at one side of the bent line CL, and first holes H1 and second holes H2 arranged at the other side of the bent line CL. Alternatively, the bent portion CRU may include first holes H1 and second holes H2 overlapping the bent line CL.

The driving voltage line VSL includes a first driving voltage line VSL1 and a second driving voltage line VSL2.

The width of the first driving voltage line VSL1 may be wider than the width of the second driving voltage line VSL2. Each of the widths of the first driving voltage line VSL1 and the second driving voltage line VSL2 is measured in a direction (hereinafter, "latitudinal direction") perpendicular to the longitudinal direction of each of the widths of the first driving voltage line VSL1 and the second driving voltage line VSL2. The first driving voltage line VSL1 and the second driving voltage line VSL2 may partially overlap each other in the third direction (i.e., Z-axis direction). The first driving voltage line VSL1 includes first holes H1 and the second driving voltage line VSL2 includes second holes H2.

The first holes H1 may be arranged along the longitudinal direction of the driving voltage line VSL. The longitudinal direction of the driving voltage line VSL may be the same as the longitudinal direction of the first driving voltage line VSL1 and the longitudinal direction of the second driving voltage line VSL2. For example, the longitudinal direction of the driving voltage line VSL disposed along the first side S1 may be the second direction (i.e., Y-axis direction).

The first holes H1 may also be arranged along the latitudinal direction of the driving voltage line VSL. The latitudinal direction of the driving voltage line VSL may be the same as the latitudinal direction of the first driving voltage line VSL1 and the latitudinal direction of the second driving voltage line VSL2. The latitudinal direction of the driving voltage line VSL disposed along the first side S1 of the driving voltage line VSL may be the first direction (i.e., X-axis direction).

Any one of the first holes H1 arranged in any one row and the first holes H1 arranged in another row adjacent thereto may be disposed in a diagonal direction to each other. Here, the first holes H1 arranged in any one row refer to first holes H1 arranged along the latitudinal direction of the driving voltage line VSL. The diagonal direction may be a direction between the longitudinal direction of the driving voltage line VSL and the latitudinal direction of the driving voltage line VSL. For example, the diagonal direction may be a direction of 45 degrees (°) or 135° from the latitudinal direction of the driving voltage line VSL.

Any one of the first holes H1 arranged in any one column and the second holes H2 arranged in another column adjacent thereto may be disposed in the latitudinal direction with respect to the any one of the first holes H1 in a plan view. Here, the first holes H1 arranged in any one column refer to first holes H1 disposed along the longitudinal direction of the driving voltage line VSL. The second holes H2 arranged in any one column refer to second holes H2 arranged along the longitudinal direction of the driving voltage line VSL.

The first holes H1 and the second holes H2 may be alternately arranged in the latitudinal direction of the driving voltage line VSL in a plan view. For example, the first holes H1 and the second holes H2 may be arranged in the latitudinal direction of the driving voltage line VSL in order of the first hole H1, the second hole H2, the first hole H1, and the second hole H2. The second hole H2 may be disposed between the first holes H1 adjacent to each other in the latitudinal direction of the driving voltage line VSL in the plan view.

The first holes H1 and the second holes H2 may be alternately arranged in the longitudinal direction of the driving voltage line VSL in the plan view. For example, the first holes H1 and the second holes H2 may be arranged in the longitudinal direction of the driving voltage line VSL in order of the first hole H1, the second hole H2, the first hole H1, and the second hole H2. The second hole H2 may be disposed between the first holes H1 adjacent to each other in the longitudinal direction of the driving voltage line VSL.

The encapsulation organic layer (192 in FIG. 7) is formed by an inkjet process in which an organic material is dropped, and, in this case, the organic material may flow from the display area DA to the non-display area NDA. As shown in FIG. 8, since the first hole H1 disposed in any one row and the first hole H1 disposed in another row adjacent thereto may be disposed in a diagonal direction to each other and the first hole H1 disposed in any one column and the first hole H1 disposed in another column adjacent thereto may be disposed in a diagonal direction to each other, the organic material flows in zigzag while avoiding the first holes H1 in a direction of the arrow of FIG. 8. Thus, since the moving speed of the organic material flowing from the display area DA to the non-display area NDA may be lowered, it is possible to prevent the organic material from overflowing the first dam DAM1 and the second dam DAM2.

Figure 9:
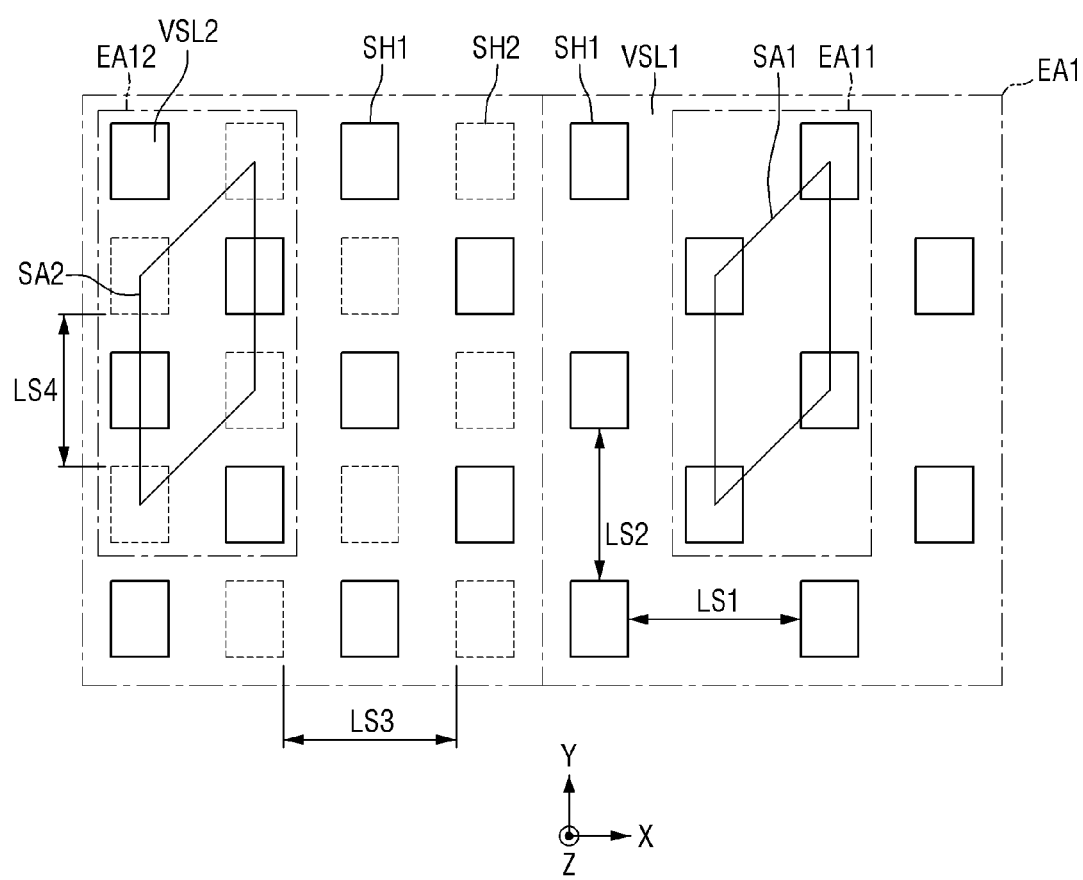
FIG. 9 is a layout view specifically illustrating an example of first holes of a first driving voltage line and second holes of a second driving voltage line in the straight portion of FIG. 8.
Figure 10:
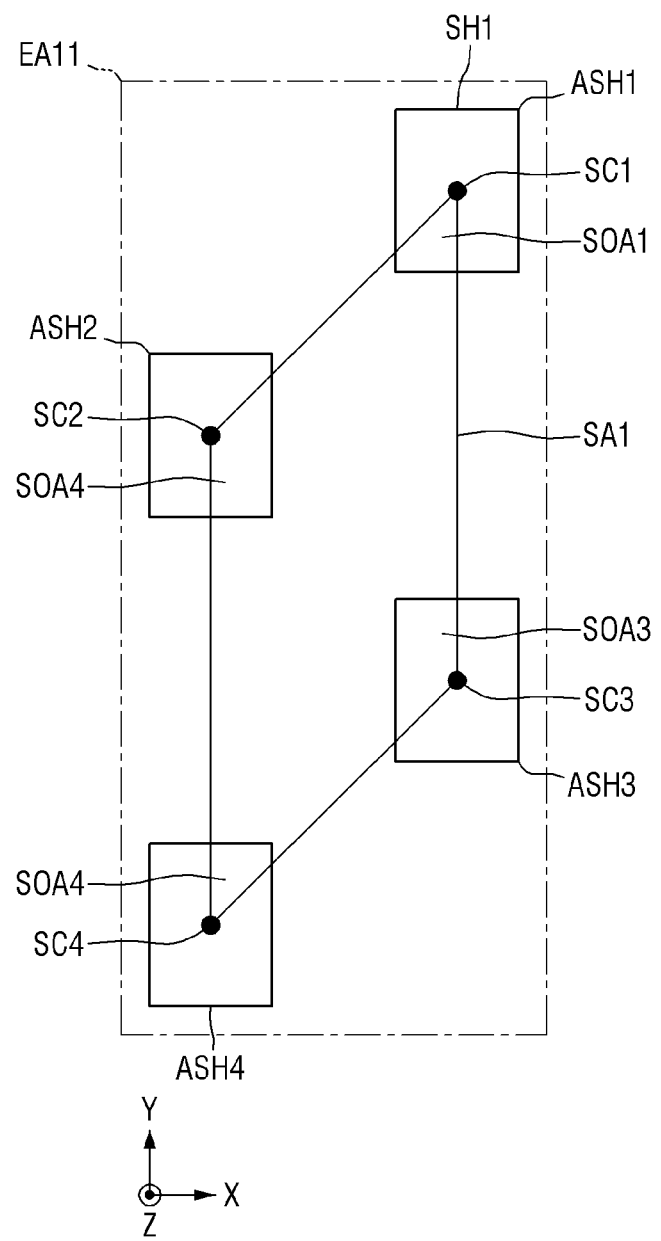
FIG. 10 is a layout view for explaining a first straight area formed by the first holes of FIG. 9.
Figure 11:
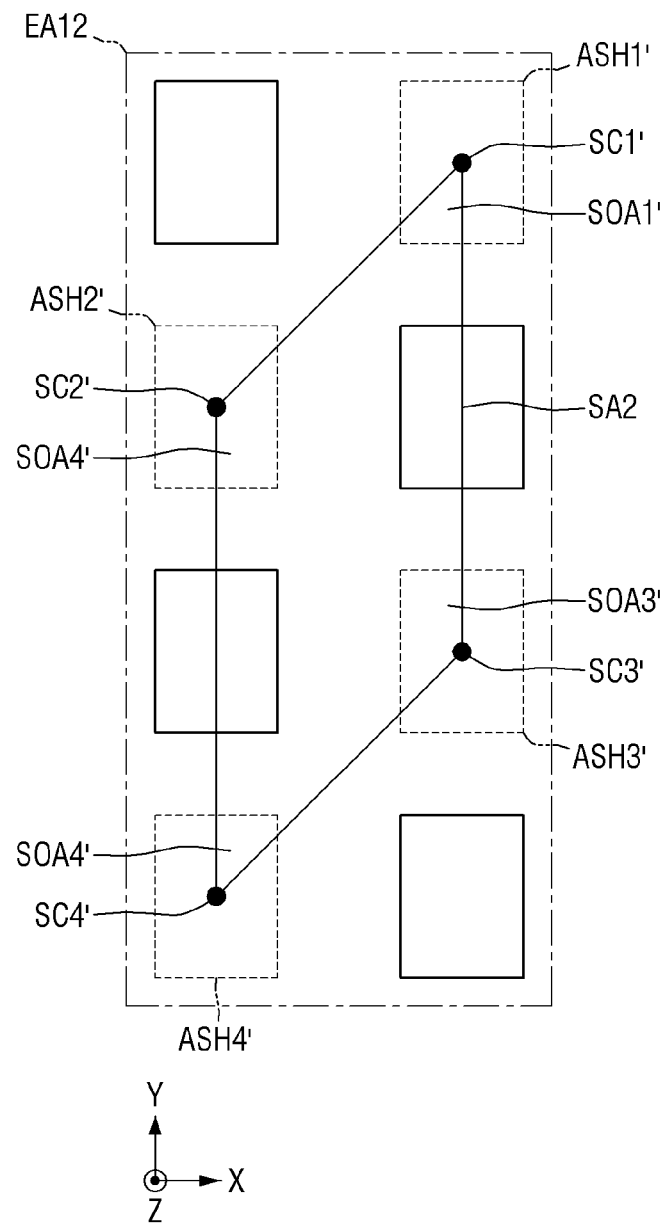
FIG. 11 is a layout view for explaining a second straight area formed by the second holes of FIG. 9.

FIG. 9 is a layout view specifically illustrating an example of first holes of a first driving voltage line and second holes of a second driving voltage line in the straight portion of FIG. 8, FIG. 10 is a layout view for explaining a first straight area formed by the first holes of FIG. 9, and FIG. 11 is a layout view for explaining a second straight area formed by the second holes of FIG. 9.

FIG. 9 illustrates an example of the first area EA1 of FIG. 8. FIG. 10 illustrates an example of the first straight sub-area EA11 of FIG. 9. FIG. 11 illustrates an example of the second linear sub-area EA12 of FIG. 9.

Referring to FIGS. 9 to 11, the first holes H1 include first straight holes SH1 arranged in the straight portion SRU of the first driving voltage line VSL1 and first bent holes (CH1 of FIG. 12) arranged in the bent portion CRU of the first driving voltage line VSL1. The second holes H2 include second straight holes SH2 arranged in the straight portion SRU of the second driving voltage line VSL2 and second bent holes (CH2 of FIG. 13) arranged in the bent portion CRU of the second driving voltage line VSL2.

Since the first hole H1 disposed in any one row and the first hole H1 disposed in another row adjacent thereto may be disposed in a diagonal direction to each other and the first hole H1 disposed in any one column and the first hole H1 disposed in another column adjacent thereto may be disposed in a diagonal direction to each other, in the inkjet process for forming the encapsulation organic layer 192, the moving speed of the organic material flowing from the display area DA to the non-display area NDA may be lowered. Therefore, it is possible to prevent the organic material from overflowing the first dam DAM1 and the second dam DAM2. Further, outgas of the first planarization layer 150 and the second planarization layer 160 may be discharged through the first holes H1 of the first driving voltage line VSL1 and the second holes H2 of the second driving voltage line VSL2. Therefore, in order to not only reduce the moving speed of the organic material but also easily discharge the outgas of the first planarization layer 150 and the second planarization layer 160, it is preferable that the first straight holes SH1 and the second straight holes SH2 are uniformly arranged.

For this purpose, the distance LS1 between the first straight holes SH1 adjacent to each other in the latitudinal direction of the first driving voltage line VSL1 in the straight portion SRU of the driving voltage line VSL may be uniform. Further, the distance LS2 between the first straight holes SH1 adjacent to each other in the longitudinal direction of the first driving voltage line VSL1 in the straight portion SRU of the driving voltage line VSL may be uniform. In this specification, the distance between the two components refers to the minimum distance between the two components.

Further, the distance LS3 between the second straight holes SH2 adjacent to each other in the latitudinal direction of the second driving voltage line VSL2 in the straight portion SRU of the driving voltage line VSL may be uniform. Further, the distance LS4 between the second straight holes SH2 adjacent to each other in the longitudinal direction of the second driving voltage line VSL2 in the straight portion SRU of the driving voltage line VSL may be uniform.

Further, the distance LS1 between the first straight holes SH1 adjacent to each other in the latitudinal direction of the first driving voltage line VSL1 in the straight portion SRU of the driving voltage line VSL may be substantially the same as the distance LS3 between the second straight holes SH2 adjacent to each other in the latitudinal direction of the second driving voltage line VSL2 in the straight portion SRU of the driving voltage line VSL.

Further, the distance LS2 between the second straight holes SH2 adjacent to each other in the longitudinal direction of the first driving voltage line VSL1 in the straight portion SRU of the driving voltage line VSL may be substantially the same as the distance LS4 between the second straight holes SH2 adjacent to each other in the longitudinal direction of the second driving voltage line VSL2 in the straight portion SRU of the driving voltage line VSL.

Further, as shown in FIG. 10, among the first straight holes SH1, the four first straight holes SH1 adjacent to each other may be defined as a first adjacent straight hole ASH1, a second adjacent straight hole ASH2, a third adjacent straight hole ASH3, and a fourth adjacent straight hole ASH4. The first adjacent straight hole ASH1 and the third adjacent straight hole ASH3 may be disposed in the second direction (i.e., Y-axis direction), and the second adjacent straight hole ASH2 and the fourth adjacent straight hole ASH4 may be disposed in the second direction (i.e., Y-axis direction). The first adjacent straight hole ASH1 and the second adjacent straight hole ASH2 may be disposed in a diagonal direction to each other, and the third adjacent straight hole ASH3 and the fourth adjacent straight hole ASH4 may be disposed in a diagonal direction to each other. The diagonal direction may be a direction between the first direction (i.e., X-axis direction) and the second direction (i.e., Y-axis direction).

The area of the quadrangle connecting a center point SC1 of the first adjacent straight hole ASH1, a center point SC2 of the second adjacent straight hole ASH2, a center point SC3 of the third adjacent straight hole ASH3, and a center point SC4 of the fourth adjacent straight hole ASH4 may be defined as a first straight area SA1. The line connecting the center point SC1 of the first adjacent straight hole ASH1 and the center point SC2 of the second adjacent straight hole ASH2 and the line connecting the center point SC3 of the third adjacent straight hole ASH3 and the center point SC4 of the fourth adjacent straight hole ASH4 may be in parallel to each other. The line connecting the center point SC1 of the first adjacent straight hole ASH1 and the center point SC3 of the third adjacent straight hole ASH3 and the line connecting the center point SC2 of the second adjacent straight hole ASH2 and the center point SC4 of the fourth adjacent straight hole ASH4 may be in parallel to each other. Therefore, the first straight area SA1 may be a parallelogram.

The overlap area of the first straight area SA1 and the first adjacent straight hole ASH1 may be defined as a first straight overlap area SOA1. The overlap area of the first straight area SA1 and the second adjacent straight hole ASH2 may be defined as a second straight overlap area SOA2. The overlap area of the first straight area SA1 and the third adjacent straight hole ASH3 may be defined as a third straight overlap area SOA3. The overlap area of the first straight area SA1 and the fourth adjacent straight hole ASH4 may be defined as a fourth straight overlap area SOA4. In this case, the ratio SR1 of the adjacent straight holes ASH1, ASH2, ASH3, and ASH4 to the first straight area SA1 may be calculated by Equation 2.

$$SR1 = \frac{SOA1 + SOA2 + SOA3 + SOA4}{SA1} \times 100 \quad \text{[Equation 2]}$$

The ratio SR1 of the adjacent straight holes ASH1, ASH2, ASH3, and ASH4 to the first straight area SA1 may be 15 percentages (%) to 25%. When the ratio SR1 of the adjacent straight holes ASH1, ASH2, ASH3, and ASH4 to the first straight area SA1 is less than 15%, the area of the second planarization layer 160 through which outgas is discharged is reduced, so that the light emitting layer of the light emitting elements LE in the display area DA may be damaged by the outgas that has not been discharged. Further, when the ratio SR1 of the adjacent straight holes ASH1, ASH2, ASH3, and ASH4 to the first straight area SA1 is more than 25%, the resistance of the driving voltage line VSL decreases due to the reduction in the area of the first driving voltage line VSL1, so that a difference in driving voltage for each location of the display panel 100 may increase.

Moreover, as shown in FIG. 11, among the second straight holes SH2, the four second straight holes SH2 adjacent to each other may be defined as a first adjacent straight hole ASH1', a second adjacent straight hole ASH2', a third adjacent straight hole ASH3', and a fourth adjacent straight hole ASH4'. The first adjacent straight hole ASH1' and the third adjacent straight hole ASH3' may be disposed in the second direction (i.e., Y-axis direction), and the second adjacent straight hole ASH2' and the fourth adjacent straight hole ASH4' may be disposed in the second direction (i.e., Y-axis direction). The first adjacent straight hole ASH1' and the second adjacent straight hole ASH2 may be disposed in a diagonal direction to each other, and the third adjacent straight hole ASH3' and the fourth adjacent straight hole ASH4' may be disposed in a diagonal direction to each other.

The area of the quadrangle connecting a center point SC1' of the first adjacent straight hole ASH1', a center point SC2' of the second adjacent straight hole ASH2', a center point SC3' of the third adjacent straight hole ASH3', and a center point SC4' of the fourth adjacent straight hole ASH4' may be defined as a second straight area SA2. The line connecting the center point SC1' of the first adjacent straight hole ASH1' and the center point SC2' of the second adjacent straight hole ASH2' and the line connecting the center point SC3' of the third adjacent straight hole ASH3' and the center point SC4' of the fourth adjacent straight hole ASH4' may be in parallel to each other. The line connecting the center point SC1' of the first adjacent straight hole ASH1' and the center point SC3' of the third adjacent straight hole ASH3' and the line connecting the center point SC2' of the second adjacent straight hole ASH2' and the center point SC4' of the fourth adjacent straight hole ASH4' may be in parallel to each other. Therefore, the second straight area SA2 may be a parallelogram.

The overlap area of the second straight area SA2 and the first adjacent straight hole ASH1' may be defined as a first staging overlap area SOA1'. The overlap area of the second straight area SA2 and the second adjacent straight hole ASH2' may be defined as a second staging overlap area SOA2'. The overlap area of the second straight area SA2 and the third adjacent straight hole ASH3' may be defined as a third staging overlap area SOA3'. The overlap area of the second straight area SA2 and the fourth adjacent straight hole ASH4' may be defined as a fourth staging overlap area SOA4'. In this case, the ratio SR2 of the adjacent straight holes ASH1', ASH2', ASH3', and ASH4' to the second straight area SA2 may be calculated by Equation 3.

$$SR2 = \frac{SOA1' + SOA2' + SOA3' + SOA4'}{SA2} \times 100 \quad \text{[Equation 3]}$$

The ratio SR2 of the adjacent straight holes ASH1', ASH2', ASH3', and ASH4' to the second straight area SA2 may be 15% to 25%. When the ratio SR2 of the adjacent straight holes ASH1', ASH2', ASH3', and ASH4' to the second straight area SA2 is less than 15%, the area of the first planarization layer 150 through which outgas is discharged is reduced, so that the light emitting layer of the light emitting elements LE in the display area DA may be damaged by the outgas that has not been discharged. Further, when the ratio SR2 of the adjacent straight holes ASH1', ASH2', ASH3', and ASH4' to the second straight area SA2 is more than 25%, the resistance of the driving voltage line VSL decreases due to the reduction in the area of the second driving voltage line VSL2, so that a difference in driving voltage for each location of the display panel 100 may increase.

The difference between the ratio SR1 of the adjacent straight holes ASH1, ASH2, ASH3, and ASH4 to the first straight area SA1 and the ratio SR2 of the adjacent straight holes ASH1', ASH2', ASH3', and ASH4' to the second straight area SA2 may be less than 1%. Preferably, the ratio SR1 of the adjacent straight holes ASH1, ASH2, ASH3, and ASH4 to the first straight area SA1 may be substantially the same as the ratio SR2 of the adjacent straight holes ASH1', ASH2', ASH3', and ASH4' to the second straight area SA2.

As shown in FIGS. 9 to 11, in the straight portion SRU of the driving voltage line VSL, the first straight holes SH1 are uniformly arranged, and the second straight holes SH2 are uniformly arranged. Thus, in the inkjet process for forming the encapsulation organic layer 192, the moving speed of the organic material flowing from the display area DA to the non-display area NDA may be lowered, and outgas of the first planarization layer 150 and the second planarization layer 160 may be easily discharged.

Figure 12:
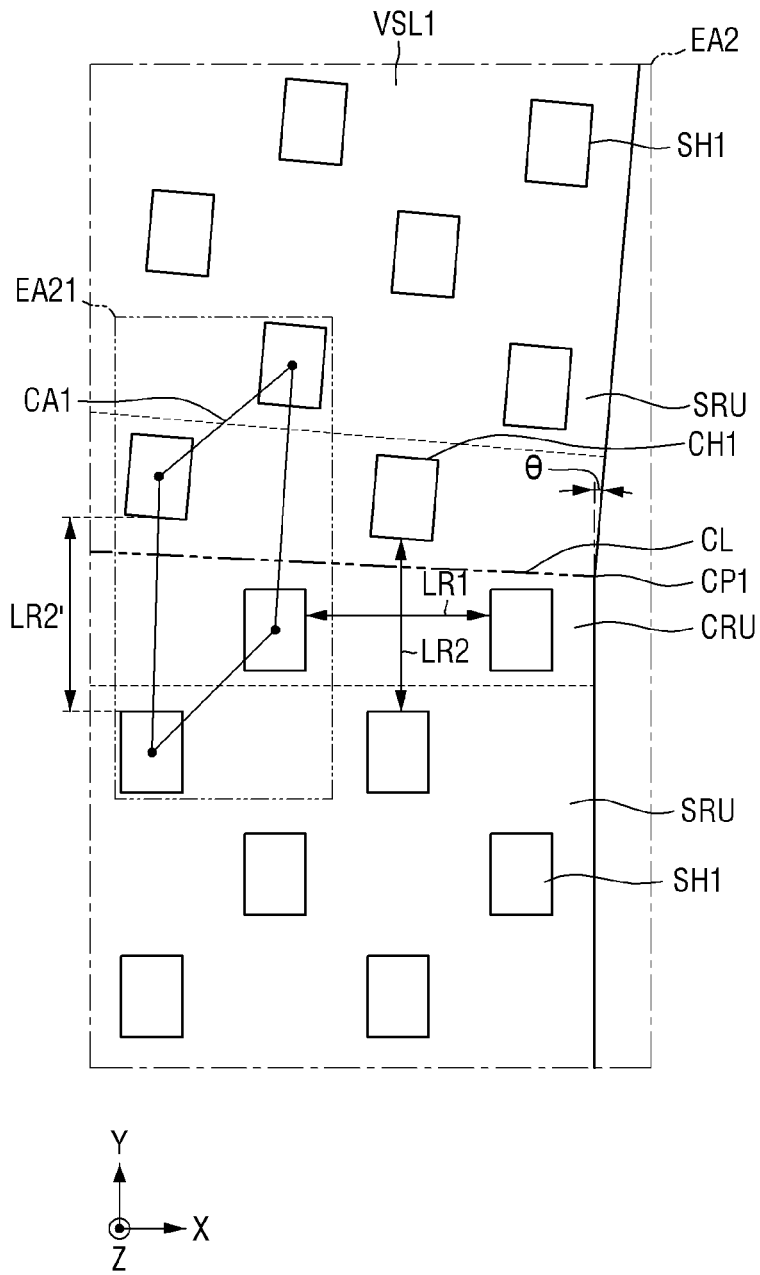
FIG. 12 is a layout view specifically illustrating an example of first holes of a first driving voltage line in the bent portion of FIG. 8.
Figure 13:
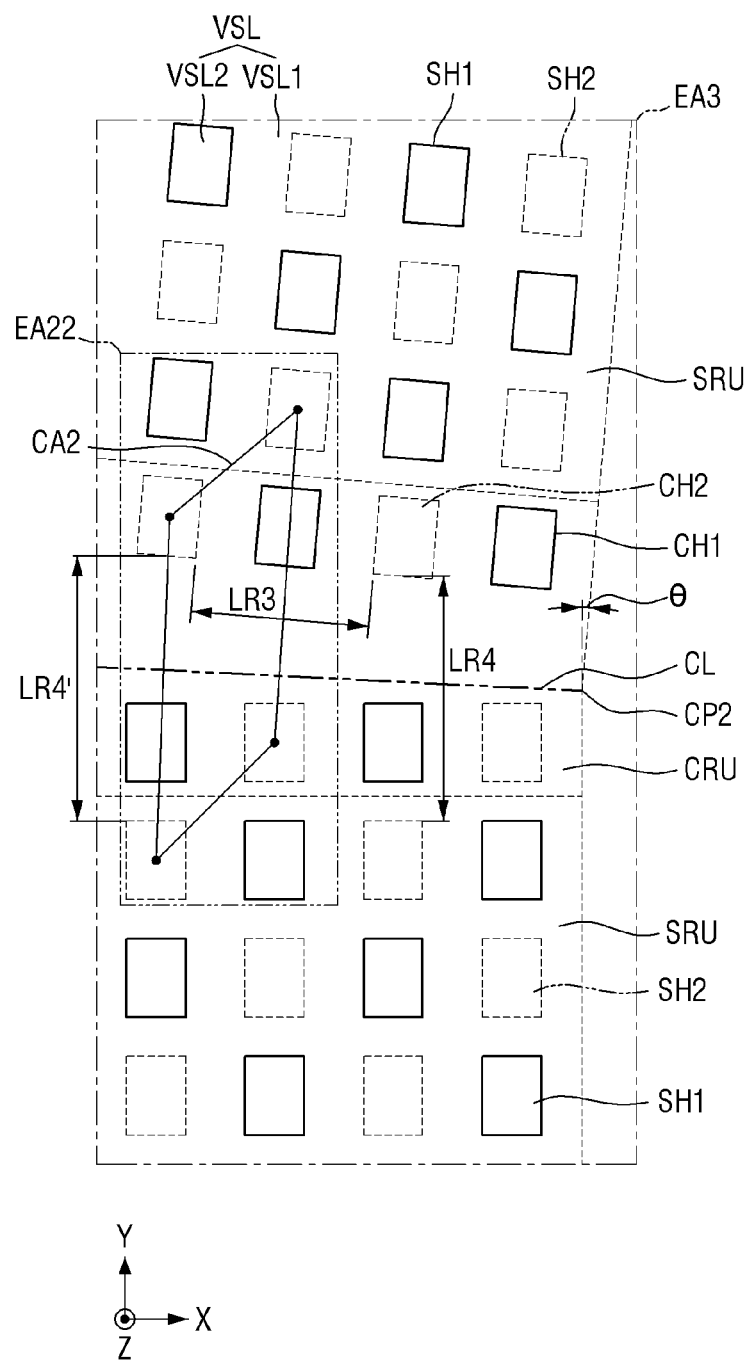
FIG. 13 is a layout view specifically illustrating an example of second holes of a first driving voltage line in the bent portion of FIG. 8.
Figure 14:
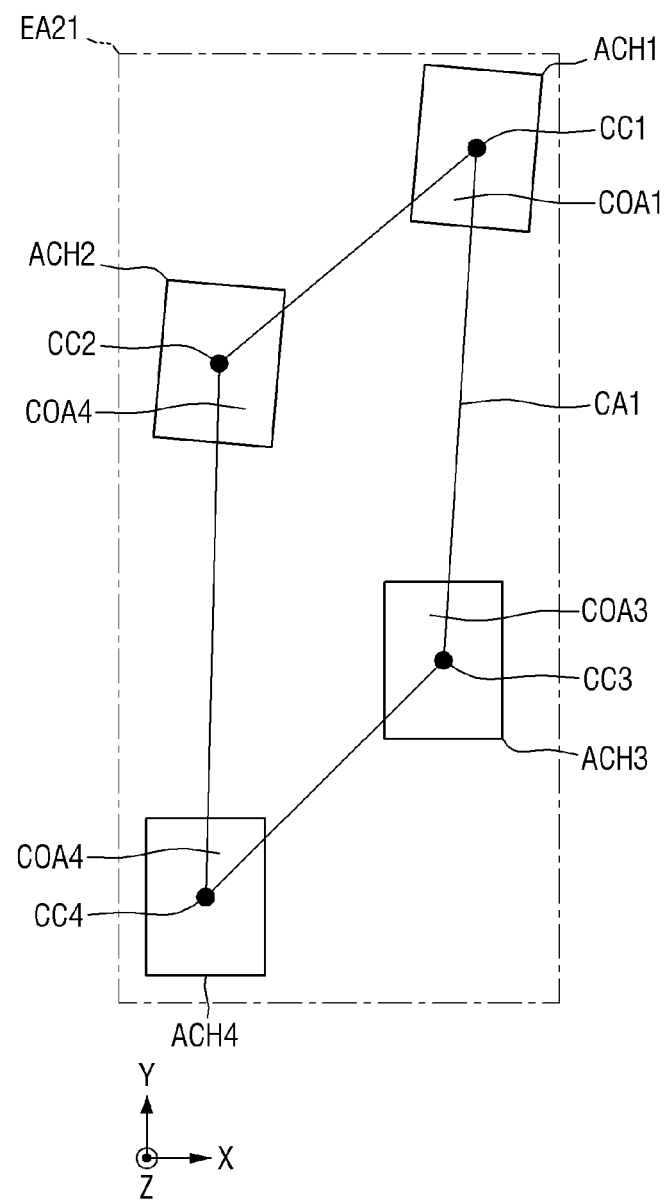
FIG. 14 is a layout view for explaining a first bent area formed by the first holes of FIG. 12.
Figure 15:
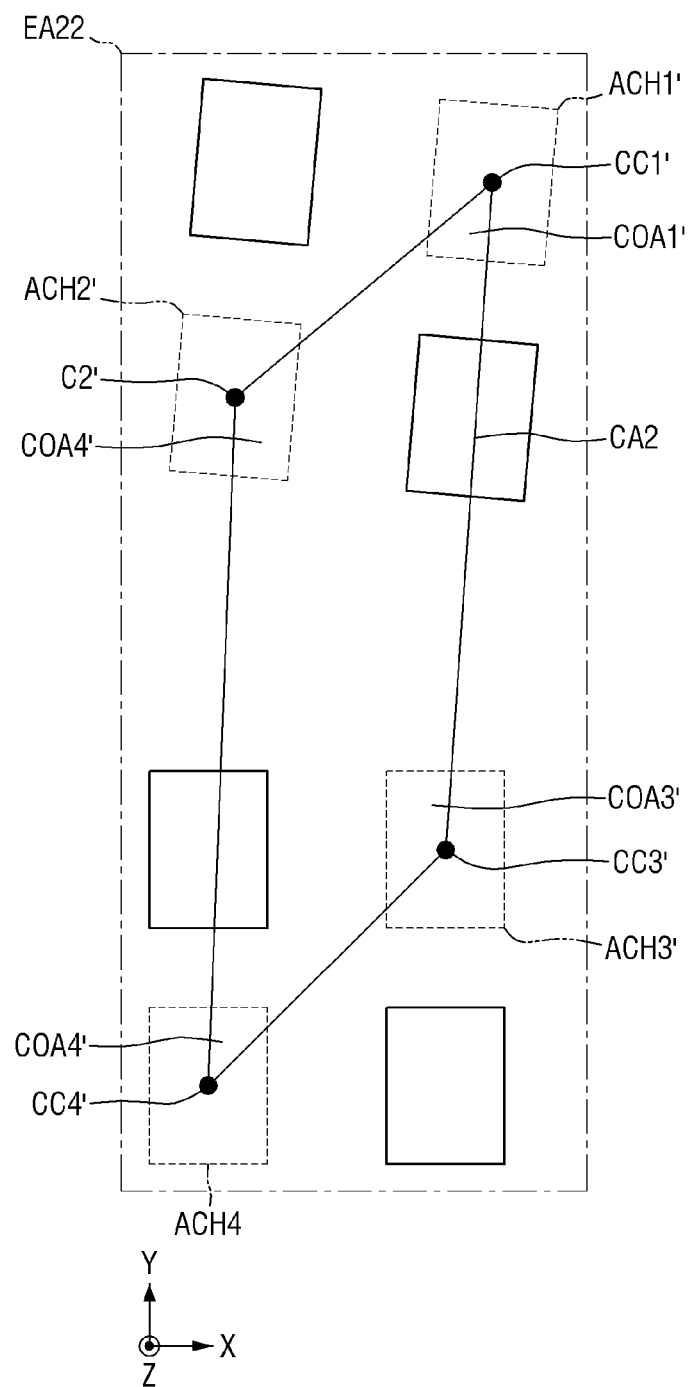
FIG. 15 is a layout view for explaining a second bent area formed by the second holes of FIG. 13.

FIG. 12 is a layout view specifically illustrating an example of first holes of a first driving voltage line in the bent portion of FIG. 8, FIG. 13 is a layout view specifically illustrating an example of second holes of a first driving voltage line in the bent portion of FIG. 8, FIG. 14 is a layout view for explaining a first bent area formed by the first holes of FIG. 12, and FIG. 15 is a layout view for explaining a second bent area formed by the second holes of FIG. 13.

FIG. 12 illustrates an example of the second area EA2 of FIG. 8. FIG. 13 illustrates an example of the third area EA3 of FIG. 8. FIG. 14 illustrates an example of the first sub-area EA21 of FIG. 12. FIG. 15 illustrates an example of the second sub-area EA22 of FIG. 13.

Referring to FIGS. 12 to 15, the bent portion CRU refers to a region where the driving voltage line VSL is bent or curved at a predetermined angle θ in the longitudinal direction of the driving voltage line VSL. The bent portion CRU may be disposed between the straight portions SRU in the longitudinal direction of the driving voltage line VSL.

The first bent holes CH1 refer to holes arranged in the bent portion CRU among the first holes H1. The second bent holes CH2 refer to holes arranged in the bent portion CRU among the second holes H2.

In the bent portion CRU, the outer length of the first driving voltage line VSL1 is longer than the inner length thereof. Therefore, when the size of the first bent hole CH1 of the first driving voltage line VSL1 is the same as the size of the first straight hole SH1 thereof, the distance (LR2/LR2') between the first bent hole CH1 and the first straight hole SH1 in the longitudinal direction of the first driving voltage line VSL1 may increase from the inside of the first driving voltage line VSL1 toward the outside thereof. Further, when the size of the second bent hole CH2 of the second driving voltage line VSL2 is the same as the size of the second straight hole SH2 thereof, the distance (LR4/LR4') between the second bent hole CH2 and the second straight hole SH2 in the longitudinal direction of the second driving voltage line VSL2 may increase from the inside of the second driving voltage line VSL2 toward the outside thereof.

In the bent portion CRU of the driving voltage line VSL, the distance LR1 between the first bent holes CH1 adjacent to each other in the latitudinal direction of the first driving voltage line VSL1 may be uniform. In the bent portion CRU of the driving voltage line VSL, the distance LR3 between the second bent holes CH2 adjacent to each other in the latitudinal direction of the second driving voltage line VSL2 may be uniform. In the bent portion CRU of the driving voltage line VSL, the distance LR1 between the first bent holes CH1 adjacent to each other in the latitudinal direction of the first driving voltage line VSL1 may be substantially the same as the distance LR3 between the second bent holes CH2 adjacent to each other in the latitudinal direction of the second driving voltage line VSL2.

Further, as shown in FIG. 14, the four first bent holes CH1 and first straight holes SH1 adjacent to each other may be defined as a first adjacent hole ACH1, a second adjacent hole ACH2, a third adjacent hole ACH3, and a fourth adjacent hole ACH4. The first adjacent hole ACH1 and the fourth adjacent hole ACH4 may be the first bent hole CH1, and the second adjacent hole ACH2 and the third adjacent hole ACH3 may be the first straight hole SH1.

The first adjacent hole ACH1 and the third adjacent hole ACH3 may disposed in the longitudinal direction of the first driving voltage line VSL1, and the second adjacent hole ACH2 and the fourth adjacent hole ACH4 may be disposed in the longitudinal direction of the first driving voltage line VSL1. The first adjacent hole ACH1 and the second adjacent hole ACH2 may be disposed in a diagonal direction to each other, and the third adjacent hole ACH3 and the fourth adjacent hole ACH4 may be disposed in a diagonal direction to each other.

The area of the quadrangle connecting a center point CC1 of the first adjacent hole ACH1, a center point CC2 of the second adjacent hole ACH2, a center point CC3 of the third adjacent hole ACH3, and a center point CC4 of the fourth adjacent hole ACH4 may be defined as a first bent area CA1. The line connecting the center point CC1 of the first adjacent hole ACH1 and the center point CC2 of the second adjacent hole ACH2 and the line connecting the center point CC3 of the third adjacent hole ACH3 and the center point CC4 of the fourth adjacent hole ACH4 may form a quadrangle.

The overlap area of the first bent area CA1 and the first adjacent hole ACH1 may be defined as a first bent overlap area COA1. The overlap area of the first bent area CA1 and the second adjacent hole ACH2 may be defined as a second bent overlap area COA2. The overlap area of the first bent area CA1 and the third adjacent hole ACH3 may be defined as a third bent overlap area COA3. The overlap area of the first bent area CA1 and the fourth adjacent hole ACH4 may be defined as a fourth bent overlap area COA4. In this case, the ratio CR1 of the adjacent holes ACH1, ACH2, ACH3, and ACH4 to the first bent area CA1 may be calculated by Equation 4.

$$CR1 = \frac{COA1 + COA2 + COA3 + COA4}{CA1} \times 100 \quad \text{[Equation 4]}$$

As shown in FIGS. 12 and 14, since the distance (LR2/LR2') between the first bent hole CH1 and the first straight hole SH1 in the longitudinal direction of the first driving voltage line VSL1 increases from the inside of the first driving voltage line VSL1 toward the outside thereof, the first bent area CA1 may be larger than the first straight area SA1. However, since the areas of the first bent holes CH1 are substantially the same as the areas of the first straight holes SH1, the first bent overlap area COA1, the second bent overlap area COA2, the third bent overlap area COA3, and the fourth bent overlap area COA4 in the first bent area CA1 may be similar to the first straight overlap area SOA1, the second straight overlap area SOA2, the third straight overlap area SOA3, and the fourth straight overlap area SOA4 in the first straight area SA1, respectively. Therefore, the ratio CR1 of the adjacent holes ACH1, ACH2, ACH3, and ACH4 to the first bent area CA1 may be smaller than the ratio SR1 of the adjacent straight holes ASH1, ASH2, ASH3, and ASH4 to the first straight area SA1.

In this case, the difference between the ratio CR1 of the adjacent holes ACH1, ACH2, ACH3, and ACH4 to the first bent area CA1 and the ratio SR1 of the adjacent straight holes ASH1, ASH2, ASH3, and ASH4 to the first straight area SA1 may be 1% or more. In this case, it is difficult to say that the arrangement of the first bent holes CH1 in the bent portion CRU of the driving voltage line VSL is uniform with the arrangement of the first straight holes SH1 in the straight portion SRU. Thus, outgas of the second planarization layer 160 may not be easily discharged, and the light emitting layer of the light emitting elements LE of the display area DA may be damaged by outgas that have not been discharged. Further, in the inkjet process for forming the encapsulation organic layer 192, the moving speed of the organic material flowing from the display area DA to the non-display area NDA may not be lowered, and thus the organic material may overflow the first dam DAM1 and the second dam DAM2.

Further, as shown in FIG. 15, the four second bent holes CH2 and second straight holes SH2 adjacent to each other may be defined as a first adjacent hole ACH1', a second adjacent hole ACH2', a third adjacent hole ACH3', and a fourth adjacent hole ACH4'. The first adjacent hole ACH1' and the fourth adjacent hole ACH4' may be the second bent hole CH2, and the second adjacent hole ACH2' and the third adjacent hole ACH3' may be the second straight hole SH2.

The first adjacent hole ACH1' and the third adjacent hole ACH3' may disposed in the longitudinal direction of the second driving voltage line VSL2, and the second adjacent hole ACH2' and the fourth adjacent hole ACH4' may be disposed in the longitudinal direction of the second driving voltage line VSL2. The first adjacent hole ACH1' and the second adjacent hole ACH2' may be disposed in a diagonal direction to each other, and the third adjacent hole ACH3' and the fourth adjacent hole ACH4' may be disposed in a diagonal direction to each other.

The area of the quadrangle connecting a center point CC1' of the first adjacent hole ACH1', a center point CC2' of the second adjacent hole ACH2', a center point CC3' of the third adjacent hole ACH3', and a center point CC4' of the fourth adjacent hole ACH4' may be defined as a second bent area CA2. The line connecting the center point CC1' of the first adjacent hole ACH1' and the center point CC2' of the second adjacent hole ACH2' and the line connecting the center point CC3' of the third adjacent hole ACH3' and the center point CC4' of the fourth adjacent hole ACH4' may form a quadrangle.

The overlap area of the second bent area CA2 and the first adjacent hole ACH1' may be defined as a first bent overlap area COA1'. The overlap area of the second bent area CA2 and the second adjacent hole ACH2' may be defined as a second bent overlap area COA2'. The overlap area of the second bent area CA2 and the third adjacent hole ACH3' may be defined as a third bent overlap area COA3'. The overlap area of the second bent area CA2 and the fourth adjacent hole ACH4' may be defined as a fourth bent overlap area COA4'. In this case, the ratio CR2 of the adjacent holes ACH1', ACH2', ACH3', and ACH4' to the second bent area CA2 may be calculated by Equation 5.

$$CR2 = \frac{COA1' + COA2' + COA3' + COA4'}{CA2} \quad \text{[Equation 5]}$$

As shown in FIGS. 13 and 15, since the distance (LR4/LR4') between the second bent hole CH2 and the second straight hole SH2 in the longitudinal direction of the second driving voltage line VSL2 increases from the inside of the second driving voltage line VSL2 toward the outside thereof, the second bent area CA2 may be larger than the second straight area SA2. However, since the areas of the second bent holes CH2 are substantially the same as the areas of the second straight holes SH2, the first bent overlap area COA1', the second bent overlap area COA2', the third bent overlap area COA3', and the fourth bent overlap area COA4' in the second bent area CA2 may be similar to the first straight overlap area SOA1', the second straight overlap area SOA2', the third straight overlap area SOA3', and the fourth straight overlap area SOA4' in the second straight area SA2, respectively. Therefore, the ratio CR2 of the adjacent holes ACH1', ACH2', ACH3', and ACH4' to the second bent area CA2 may be smaller than the ratio SR2 of the adjacent straight holes ASH1', ASH2', ASH3', and ASH4' to the second straight area SA2.

In this case, the difference between the ratio CR2 of the adjacent holes ACH1', ACH2', ACH3', and ACH4' to the second bent area CA2 and the ratio SR2 of the adjacent straight holes ASH1', ASH2', ASH3', and ASH4' to the second straight area SA2 may be 1% or more. In this case, it is difficult to say that the arrangement of the second bent holes CH2 in the bent portion CRU of the driving voltage line VSL is uniform with the arrangement of the second straight holes SH2 in the straight portion SRU. Thus, outgas of the first planarization layer 150 may not be easily discharged, and the light emitting layer of the light emitting elements LE of the display area DA may be damaged by outgas that have not been discharged.

As shown in FIGS. 12 to 15, the distance (LR2/LR2') between the first bent hole CH1 and the first straight hole SH1 in the longitudinal direction of the first driving voltage line VSL1 may increase from the inside of the first driving voltage line VSL1 toward the outside thereof. Further, the distance (LR4/LR4') between the second bent hole CH2 and the second straight hole SH2 in the longitudinal direction of the second driving voltage line VSL2 may increase from the inside of the second driving voltage line VSL2 toward the outside thereof. That is, it is difficult to say that the arrangement of the first bent holes CH1 and the second bent holes CH2 in the bent portion CRU of the driving voltage line VSL is uniform with the arrangement of the first straight holes SH1 and the second straight holes SH2 in the straight portion SRU. Therefore, outgas of the first planarization layer 150 and the second planarization layer 160 may not be easily discharged, and the light emitting layer of the light emitting elements LE of the display area DA may be damaged by outgas that have not been discharged. Further, in the inkjet process for forming the encapsulation organic layer 192, the moving speed of the organic material flowing from the display area DA to the non-display area NDA may not be lowered, and thus the organic material may overflow the first dam DAM1 and the second dam DAM2.

FIG. 16 is a layout view specifically illustrating another example of the driving voltage line of FIG. 6.

FIG. 16 illustrates an example of the area A-1 of FIG. 6. FIG. 16 illustrates a part of the driving voltage line VSL disposed at the first side and first corner of the display panel 100.

The embodiment of FIG. 16 is different from the embodiment of FIG. 8 in that in the bent portion CRU of the driving voltage line VSL, some of the first holes H1 have different sizes from others thereof, and some of the second holes H2 have different sizes from others thereof. In FIG. 16, differences will be described in detail with reference to FIGS. 17 to 20.

Further, since the first area EA1' shown in FIG. 16 is substantially the same as that having been described with reference to FIG. 9, a description of the first area EA1' will be omitted. The second area EA2' and the third area EA3' shown in FIG. 16 will be described in detail with reference to FIGS. 17 to 20.

Figure 17:
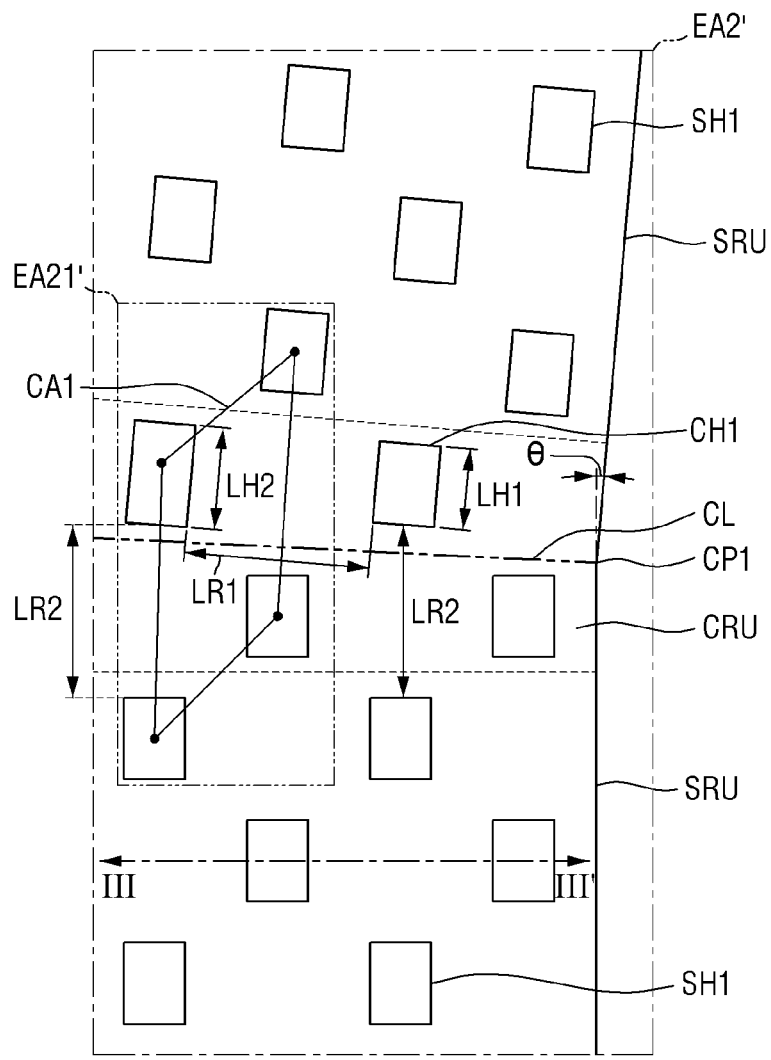
FIG. 17 is a layout view specifically illustrating an example of first holes of a first driving voltage line in the bent portion of FIG. 16.
Figure 18:
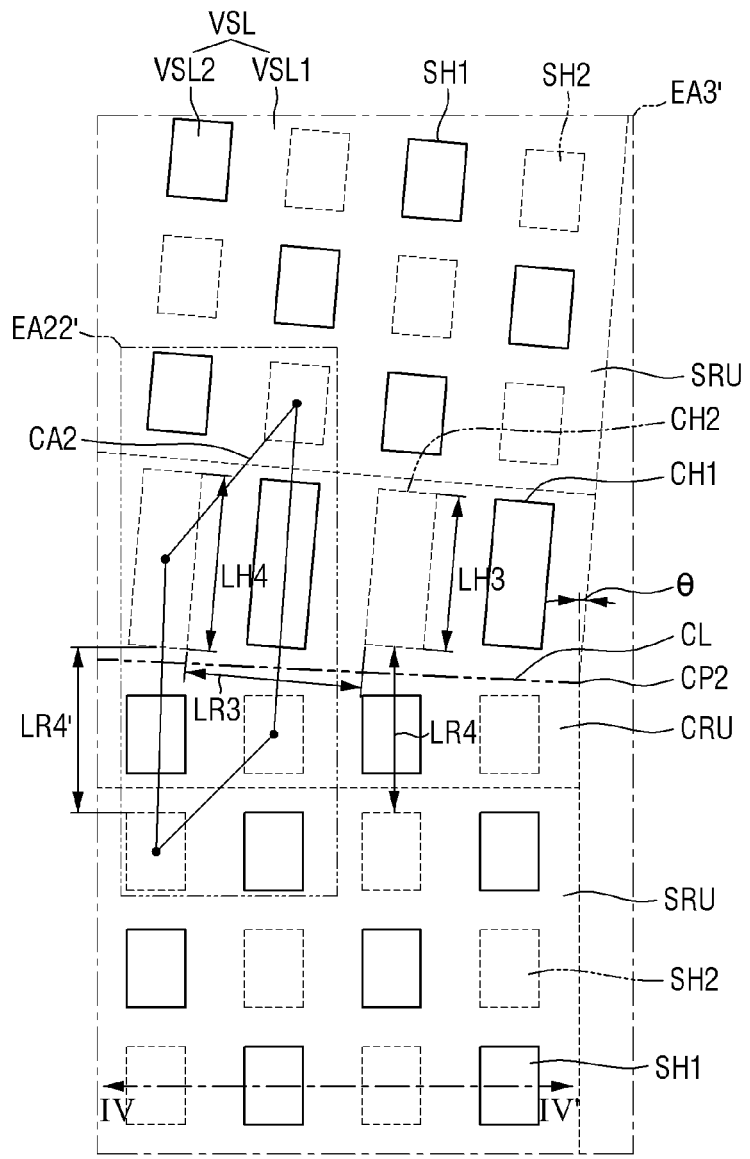
FIG. 18 is a layout view specifically illustrating an example of first holes and second hole of a first driving voltage line in the bent portion of FIG. 16.
Figure 19:
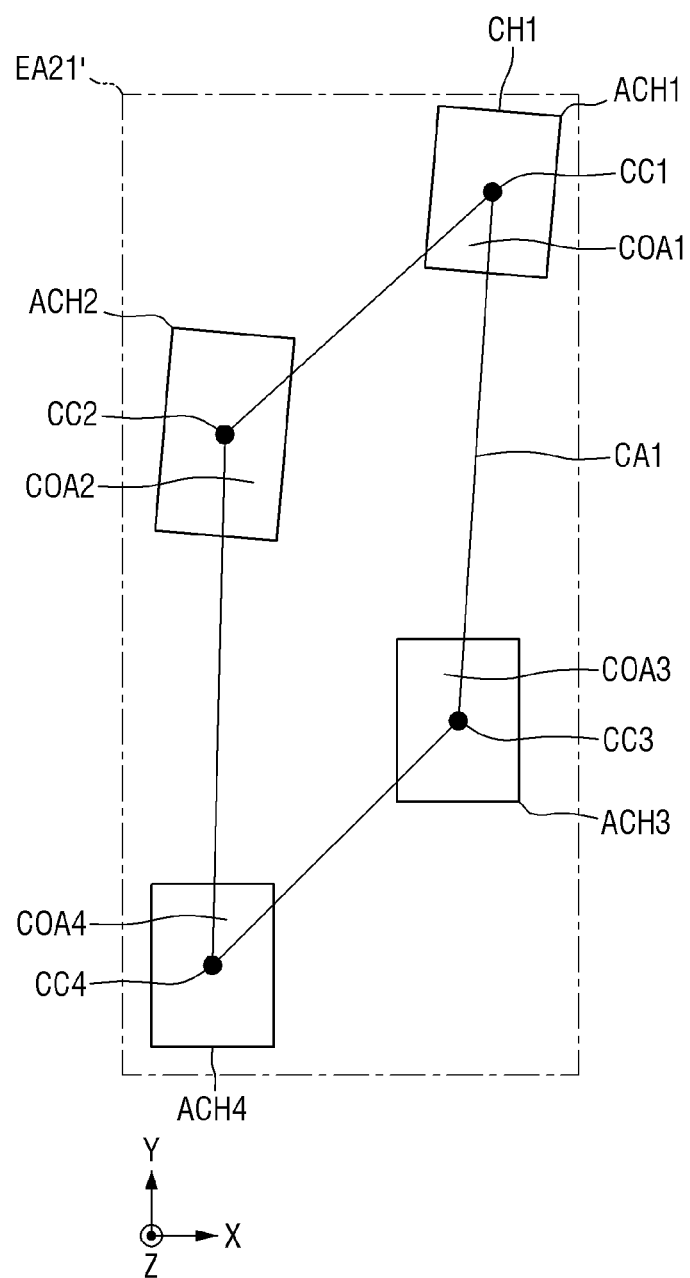
FIG. 19 is a layout view for explaining a first bent area formed by the first holes of FIG. 17.
Figure 20:
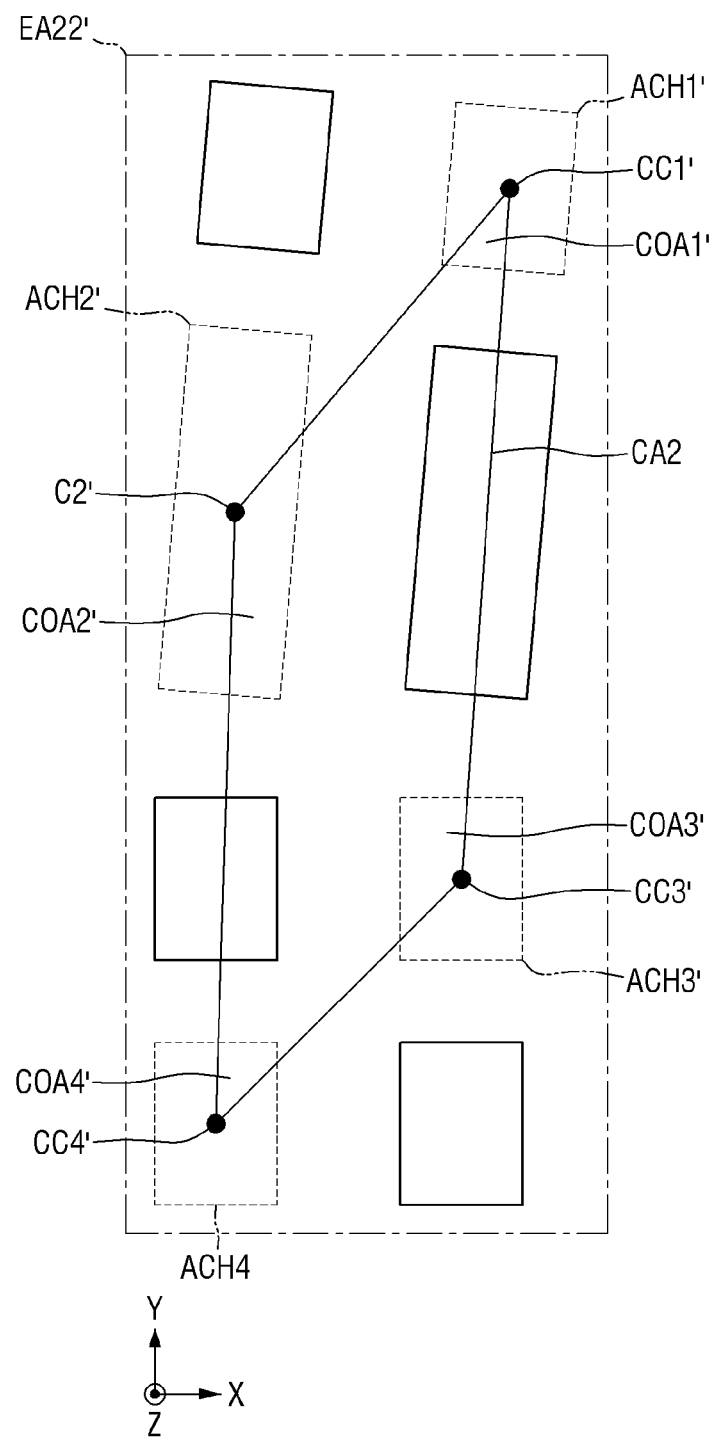
FIG. 20 is a layout view for explaining a second bent area formed by the second holes of FIG. 18.

FIG. 17 is a layout view specifically illustrating an example of first holes of a first driving voltage line in the bent portion of FIG. 16, FIG. 18 is a layout view specifically illustrating an example of first holes and second hole of a first driving voltage line in the bent portion of FIG. 16, FIG. 19 is a layout view for explaining a first bent area formed by the first holes of FIG. 17, and FIG. 20 is a layout view for explaining a second bent area formed by the second holes of FIG. 18.

FIG. 17 illustrates an example of the second area EA2' of FIG. 16. FIG. 18 illustrates an example of the third area EA3' of FIG. 16. FIG. 19 illustrates an example of the first sub-area EA21' of FIG. 18. FIG. 20 illustrates an example of the second sub-area EA22' of FIG. 19.

The embodiment of FIGS. 17 to 20 is different from the embodiment of FIGS. 12 to 15 in that the distance LR2 between the first bent hole CH1 and the first straight hole SH1 in the longitudinal direction of the first driving voltage line VSL1 is uniform, and the distance LR4 between the second bent hole CH2 and the second straight hole SH2 in the longitudinal direction of the second driving voltage line VSL2 is uniform. In FIGS. 17 to 20, differences from the embodiment of FIGS. 12 to 15 will be mainly described.

Referring to FIGS. 17 to 20, in the bent portion CRU, the outer length of the first driving voltage line VSL1 is longer than the inner length thereof. In the bent portion CRU of the driving voltage line VSL, the sizes of some of the first bent holes CH1 are different from the sizes of the first straight holes SH1. Further, in the bent portion CRU of the driving voltage line VSL, the sizes of the first bent holes CH1 adjacent to each other in the latitudinal direction of the first driving voltage line VSL1 may be different from each other. That is, in the bent portion CRU of the driving voltage line VSL, the size of the first bent hole CH1 may increase toward the outside. For example, in the bent portion CRU of the driving voltage line VSL, the size of any one first bent hole CH1 may be smaller than another first bent hole CH1 disposed outside this first cured hole CH1 in the latitudinal direction of the first driving voltage line VSL1.

Further, in the bent portion CRU of the driving voltage line VSL, the length of the first bent hole CH1 in the longitudinal direction of the first driving voltage line VSL1 may increase toward the outside. For example, in the bent portion CRU of the driving voltage line VSL, the length LH1 of any one first bent hole CH1 in the longitudinal direction of the first driving voltage line VSL1 may be smaller than the length LH2 of another first bent hole CH1 disposed outside (i.e., located farther from the display area DA) this first bent hole CH1 in the latitudinal direction of the first driving voltage line VSL1.

Further, the ratio CR1 of the adjacent holes ACH1, ACH2, ACH3, and ACH4 to the first bent area CA1 of FIG. 19 may be calculated by Equation 4 above. In the bent portion CRU of the driving voltage line VSL, the sizes of the first bent holes CH1 adjacent to each other in the latitudinal direction of the first driving voltage line VSL1 are made different from each other, thereby making the distance LR2 between the first bent hole CH1 and the first straight hole SH1 in the longitudinal direction of the first driving voltage line VSL1 uniform.

Since the second overlap area COA2 increases as the first bent area CA1 increases in the bent portion CRU of the driving voltage line VSL, the difference between the ratio CR1 of the adjacent holes ACH1, ACH2, ACH3, and ACH4 to the first bent area CA1 and the ratio SR1 of the adjacent straight holes ASH1, ASH2, ASH3, and ASH4 to the first straight area SA1 may be less than 1%. Preferably, the ratio CR1 of the adjacent holes ACH1, ACH2, ACH3, and ACH4 to the first bent area CA1 may be substantially the same as the ratio SR1 of the adjacent straight holes ASH1, ASH2, ASH3, and ASH4 to the first straight area SA1.

In the bent portion CRU of the driving voltage line VSL, the sizes of some of the second bent holes CH2 may be different from the sizes of the second straight holes SH2 ratio SR2. Further, in the bent portion CRU of the driving voltage line VSL, the sizes of the second bent holes CH2 adjacent to each other in the latitudinal direction of the second driving voltage line VSL2 may be different from each other. That is, in the bent portion CRU of the driving voltage line VSL, the size of the second bent hole CH2 may increase toward the outside. For example, in the bent portion CRU of the driving voltage line VSL, the size of any one second bent hole CH2 may be smaller than another second bent hole CH2 disposed outside this second bent hole CH2 in the latitudinal direction of the second driving voltage line VSL2.

Further, in the bent portion CRU of the driving voltage line VSL, the length of the second bent hole CH2 in the latitudinal direction of the second driving voltage line VSL2 may increase toward the outside. For example, in the bent portion CRU of the driving voltage line VSL, the length LH3 of any one second bent hole CH2 in the latitudinal direction of the second driving voltage line VSL2 may be smaller than the length LH4 of another second bent hole CH2 disposed outside this second bent hole CH2 in the latitudinal direction of the second driving voltage line VSL2.

Further, the ratio CR2 of the adjacent holes ACH1, ACH2, ACH3, and ACH4 to the second bent area CA2 of FIG. 20 may be calculated by Equation 5 above. In the bent portion CRU of the driving voltage line VSL, the sizes of the second bent holes CH2 adjacent to each other in the latitudinal direction of the second driving voltage line VSL2 are made different from each other, thereby making the distance LR4 between the second bent hole CH2 and the second straight hole SH2 in the longitudinal direction of the second driving voltage line VSL2 uniform.

Since the second overlap area COAT increases as the second bent area CA2 increases in the bent portion CRU of the driving voltage line VSL, the difference between the ratio CR2 of the adjacent holes ACH1', ACH2', ACH3', and ACH4' to the second bent area CA2 and the ratio SR2 of the adjacent straight holes ASH1', ASH2', ASH3', and ASH4' to the second straight area SA2 may be less than 1%. Preferably, the ratio CR2 of the adjacent holes ACH1', ACH2', ACH3', and ACH4' to the second bent area CA2 may be substantially the same as the ratio SR2 of the adjacent straight holes ASH1', ASH2', ASH3', and ASH4' to the second straight area SA2.

As shown in FIGS. 17 to 20, considering that, in the bent portion CRU of the driving voltage line VSL, the outer length of the first driving voltage line VSL1 is longer than the inner length thereof, the sizes of the first bent holes CH1 and the second bent holes CH2 are adjusted. Accordingly, the distance LR2 between the first bent hole CH1 and the first straight hole SH1 in the longitudinal direction of the first driving voltage line VSL1 is substantially the same as the distance between the first straight holes SH1 in the longitudinal direction thereof, and the distance LR4 between the second bent hole CH2 and the second straight hole SH2 in the longitudinal direction of the second driving voltage line VSL2 may be substantially the same as the distance between the second straight holes SH2 in the longitudinal direction thereof. That is, it may be found that the arrangement of the first bent holes CH1 and the second bent holes CH2 in the bent portion CRU is uniform with the arrangement of the first straight holes SH1 and the second straight holes SH2 in the straight portion SRU. Therefore, in the inkjet process for forming the encapsulation organic layer 192, the moving speed of the organic material flowing from the display area DA to the non-display area NDA may be lowered, and outgas of the first planarization layer 150 and the second planarization layer 160 may be easily discharged.

Figure 21:
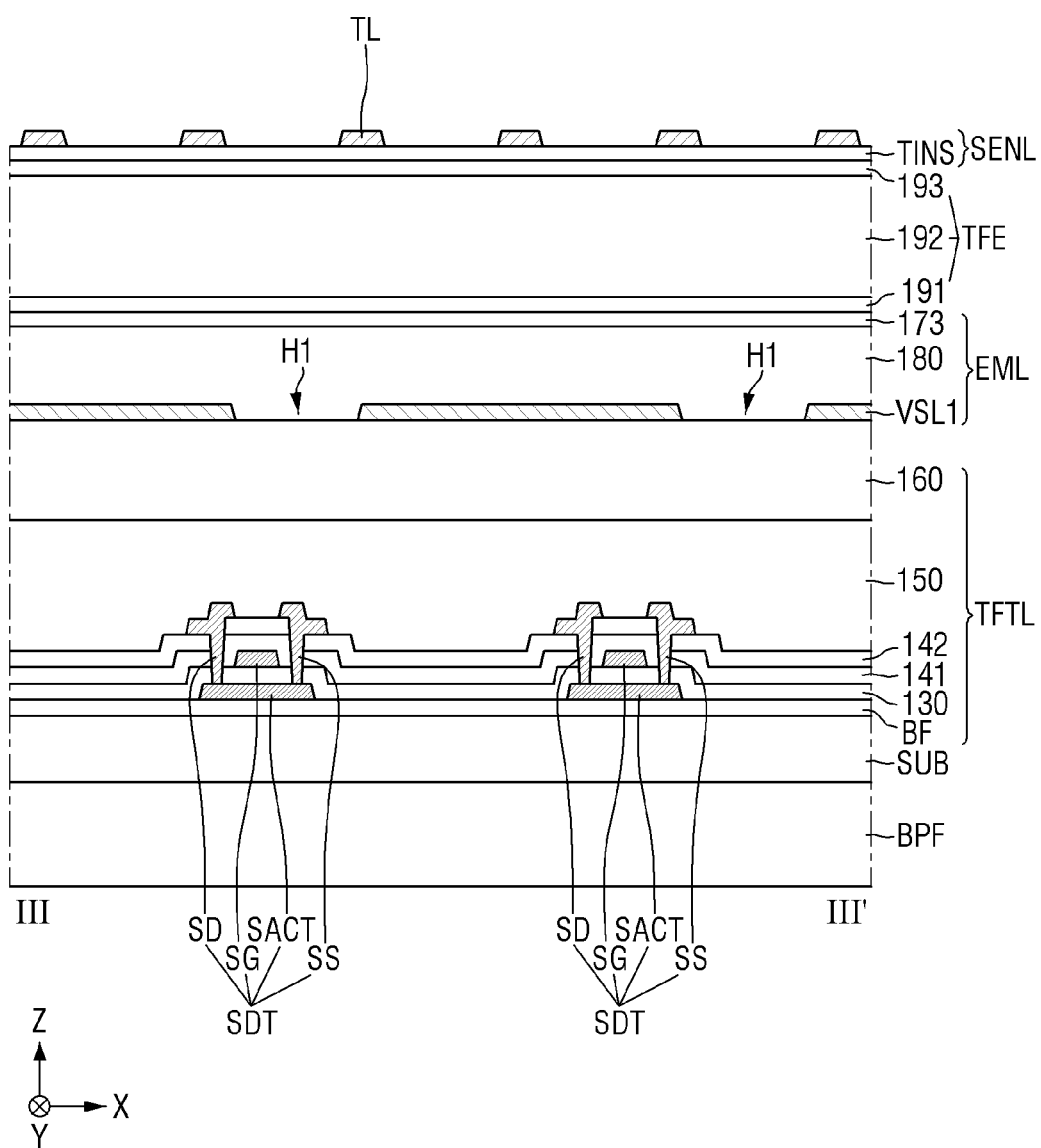
FIG. 21 is a cross-sectional view illustrating an example of the display panel taken along line of FIG. 17.
Figure 22:
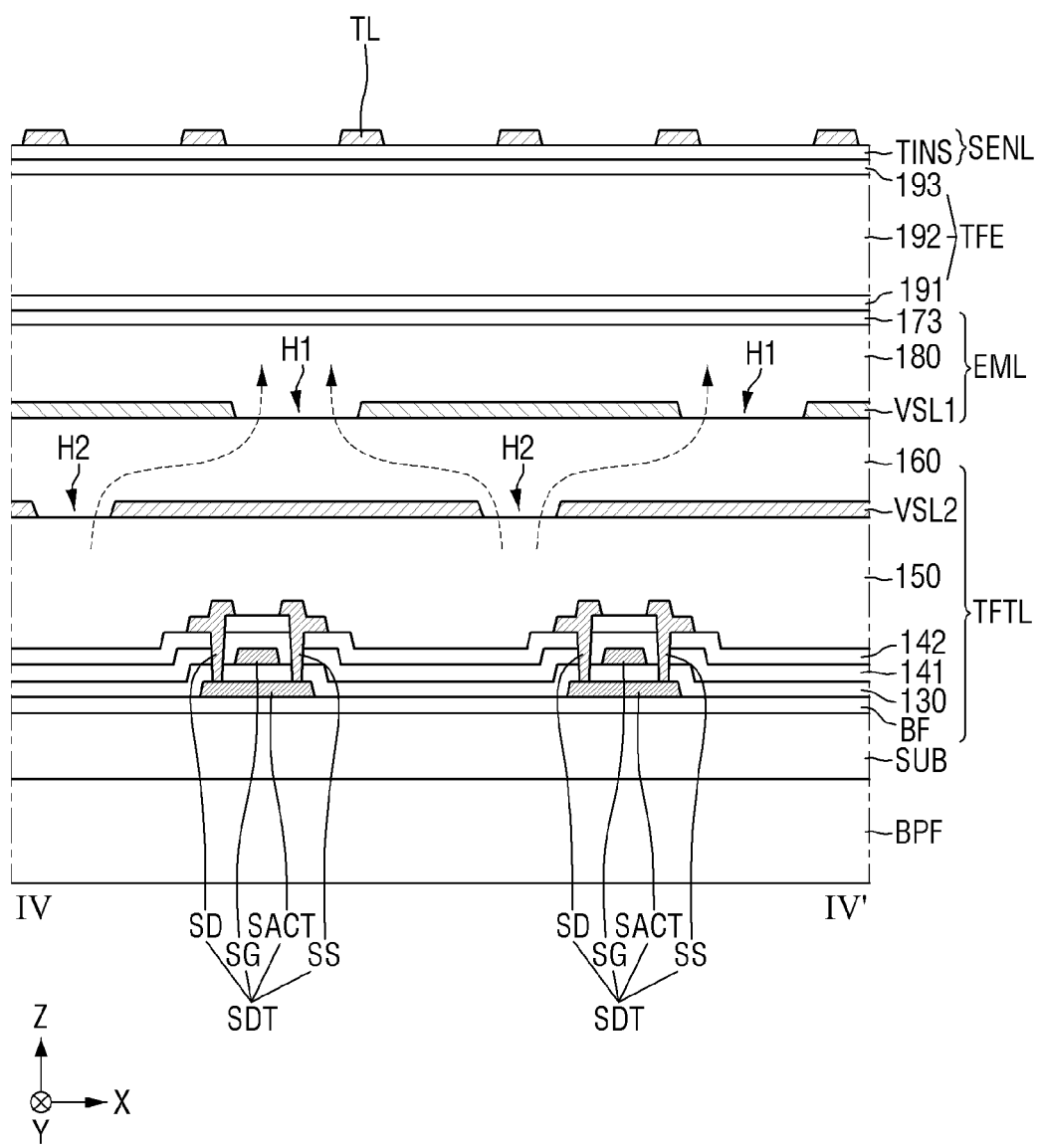
FIG. 22 is a cross-sectional view illustrating an example of the display panel taken along line IV-IV' of FIG. 18.

FIG. 21 is a cross-sectional view illustrating an example of the display panel taken along line of FIG. 17, and FIG. 22 is a cross-sectional view illustrating an example of the display panel taken along line IV-IV' of FIG. 18.

Referring to FIGS. 21 and 22, the first driving voltage line VSL1 may be disposed on the second planarization layer 160. The first driving voltage line VSL1 may be disposed on the same layer as the pixel electrode 171, and may be formed of or include the same material as the pixel electrode 171.

The second driving voltage line VSL2 may be disposed on the first planarization layer 150. The second driving voltage line VSL2 may be disposed on the same layer as the second anode connection electrode ANDE2, and may be formed of or include the same material as the second anode connection electrode ANDE2.

As shown in FIGS. 21 and 22, the outgas generated by moisture remaining in the first planarization layer 150 and the second planarization layer 160 may be discharged through the first holes H1 of the first driving voltage line VSL1 and the second holes H2 of the second driving voltage line VSL2 (refer to arrows). Therefore, it is possible to prevent the light emitting layer 172 of the light emitting element LEL from being damaged by the outgas that has not been discharged.

Figure 23:
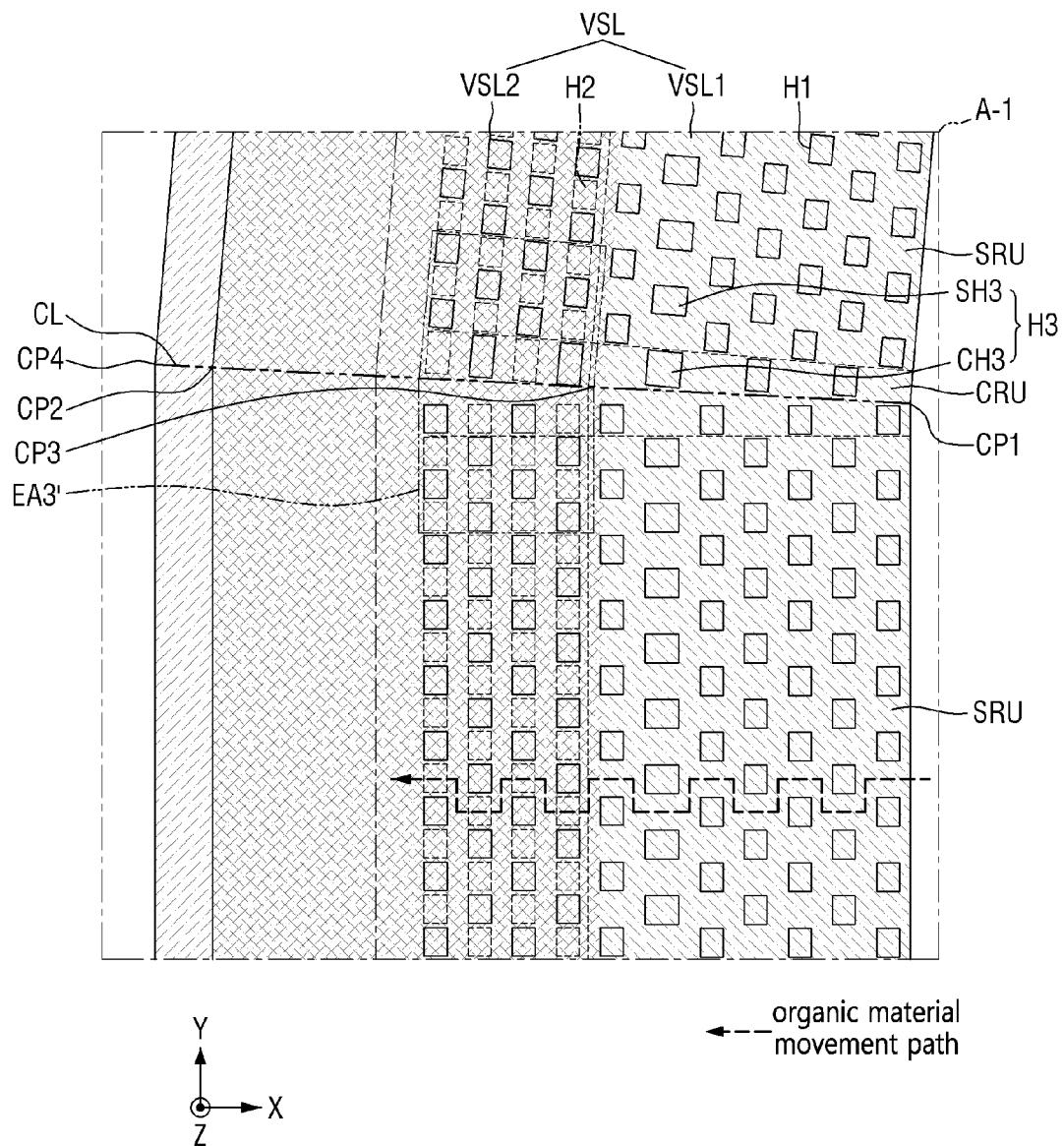
FIG. 23 is a layout view specifically illustrating another example of the driving voltage line of FIG. 6.

FIG. 23 is a layout view specifically illustrating another example of the driving voltage line of FIG. 6.

The embodiment of FIG. 23 is different from the embodiment of FIG. 16 in that the first driving voltage line VSL includes first holes H1 and third hole H3 large than the first holes H1. In FIG. 23, differences from the embodiment of FIG. 16 will be mainly described.

Referring to FIG. 23, the third holes H3 may be arranged in the longitudinal direction of the first driving voltage line VSL1. The third hole H3 may be disposed between the first holes H1 adjacent to each other in the latitudinal direction of the driving voltage line VSL.

The third holes H3 may include third straight holes SH3 arranged in the straight portion SRU and third bent holes CH3 arranged in the bent portion CRU. The sizes of the third straight holes SH3 may be larger than the sizes of the first straight holes SH1 in a plan view.

In the bent portion CRU, the outer length of the first driving voltage line VSL1 is longer than the inner length thereof. In the bent portion CRU of the driving voltage line VSL, the sizes of the third bent holes CH3 are different from the sizes of the third straight holes SH3. Further, in the bent portion CRU of the driving voltage line VSL, the sizes of the first bent holes CH1 and third bent holes CH3 adjacent to each other in the latitudinal direction of the first driving voltage line VSL1 may be different from each other. That is, in the bent portion CRU of the driving voltage line VSL, the size of the first bent hole CH1 disposed inside the third bent hole CH3 may be smaller than the size of the third bent hole CH3 in a plan view. In the bent portion CRU of the driving voltage line VSL, the size of the first bent hole CH1 disposed outside the third bent hole CH3 may be larger than the size of the third bent hole CH3.

Further, in the bent portion CRU of the driving voltage line VSL, the length of the third bent hole CH3 in the longitudinal direction of the first driving voltage line VSL1 may be longer than the length of the third straight hole SH3 in the longitudinal direction of the first driving voltage line VSL1.

As shown in FIG. 23, considering that, in the bent portion CRU of the driving voltage line VSL, the outer length of the first driving voltage line VSL1 is longer than the inner length thereof, the sizes of the third bent holes CH3 are adjusted to be larger than the sizes of the third straight holes SH3. Accordingly, the distance LR2 between the third bent hole CH3 and the third straight hole SH3 in the longitudinal direction of the first driving voltage line VSL1 is substantially the same as the distance between the third straight holes SH3 in the longitudinal direction thereof. Thus, it may be found that the arrangement of the third bent holes CH3 in the bent portion CRU is uniform with the arrangement of the third straight holes SH3 in the straight portion SRU. Therefore, in the inkjet process for forming the encapsulation organic layer 192, the moving speed of the organic material flowing from the display area DA to the non-display area NDA may be lowered, and outgas of the first planarization layer 150 and the second planarization layer 160 may be easily discharged.

The third holes H3 may overlap at least one scan clock line of the first scan driver 410 in the third direction (i.e., Z-axis direction). The scan clock signal applied to the at least one scan clock line may be one of scan timing signals for generating scan signals output to the scan lines SL. Since the overlap area of the first driving voltage line VSL1 and at least one scan clock line is reduced due to the third holes H3, the parasitic capacitance between the first driving voltage line VSL1 and at least one scan clock line may be reduced. Accordingly, the fluctuation in the first driving voltage of the first driving voltage line VSL1 may be reduced by the clock signal of at least one scan clock line.

In the embodiments of the display device, the sizes of the first bent holes and the second bent holes are adjusted since the outer length of the first driving voltage line is longer than the inner length thereof in the bent portion of the driving voltage line. Accordingly, the distance between the first bent hole and the first straight hole in the longitudinal direction of the first driving voltage line is substantially the same as the distance between the first straight holes in the longitudinal direction thereof, and the distance between the second bent hole and the second straight hole in the longitudinal direction of the second driving voltage line may be substantially the same as the distance between the second straight holes in the longitudinal direction thereof. That is, it may be found that the arrangement of the first bent holes and the second bent holes in the bent portion is uniform with the arrangement of the first straight holes and the second straight holes in the straight portion. Therefore, in the inkjet process for forming the encapsulation organic layer, the moving speed of the organic material flowing from the display area to the non-display area may be lowered, and outgas of the first planarization layer and the second planarization layer may be easily discharged.

The invention should not be construed as being limited to the exemplary embodiments set forth herein. Rather, these exemplary embodiments are provided so that this invention will be thorough and complete and will fully convey the concept of the invention to those skilled in the art.

While the invention has been particularly shown and described with reference to exemplary embodiments thereof, it will be understood by those of ordinary skill in the art that various changes in form and details may be made therein without departing from the spirit or scope of the invention.

What is claimed is:

1. A display device defining a display plane perpendicular to a thickness direction, the display device comprising:
   a display area including sub-pixels for displaying an image;
   a non-display area adjacent to the display area and comprising a first side, a second side, and a first corner at which the first side meets the second side, the first side, the second side, and the first corner being within the display plane or in a first plane parallel to the display plane; and a first driving voltage line disposed in the non-display area at the first side and the first corner and including a straight portion defining a plurality of first straight holes and a bent portion defining a plurality of first bent holes, wherein the first driving voltage line is disposed linearly in the straight portion, and is bent within the display plane or within a second plane parallel to the display plane in the bent portion, and wherein a first adjacent bent hole of the first bent holes and a first adjacent straight hole of the first straight holes are adjacent to each other in a longitudinal direction of the first driving voltage line, wherein the first adjacent bent hole and the first adjacent straight hole have different sizes from each other in a plan view, and wherein the size of the first adjacent bent hole along the longitudinal direction of the first driving voltage line is larger than the size of the first adjacent straight hole along the longitudinal direction of the first driving voltage line.

2. The display device of claim 1, wherein two first bent holes among the plurality of first bent holes have different sizes from each other, and wherein the two first bent holes are adjacent to each other in a latitudinal direction of the first driving voltage line.

3. The display device of claim 2, wherein first one of the two first bent holes is disposed outside second one of the two first bent holes, and the size of the first one is larger than the size of the second one.

4. The display device of claim 1, wherein a distance between two first straight holes among the plurality of first straight holes is the same as a distance between the first bent hole and the first straight hole, and the two first straight holes are adjacent to each other in the longitudinal direction of the first driving voltage line.

5. A display device, comprising:

a display area including sub-pixels for displaying an image;

a non-display area adjacent to the display area; and a first driving voltage line disposed in the non-display area and including a straight portion defining a plurality of first straight holes and a bent portion defining a plurality of first bent holes, wherein the first driving voltage line is disposed linearly in the straight portion, and is bent in the bent portion, and wherein the first bent hole and the first straight hole have different sizes from each other in a plan view, and wherein the first bent hole and the first straight hole is adjacent to each other in a longitudinal direction of the first driving voltage line, wherein four bent holes adjacent to each other among the first bent holes and the first straight holes are defined as a first adjacent hole, a second adjacent hole, a third adjacent hole, and a fourth adjacent hole, an area of a quadrangle connecting a center point of the first adjacent hole, a center point of the second adjacent hole, a center point of the third adjacent hole, and a center point of the fourth adjacent hole is defined as a first bent area (CA1), an overlap area of the first bent area (CA1) and the first adjacent hole is defined as a first bent overlap area (COA1), an overlap area of the first bent area (CA1) and the second adjacent hole is defined as a second bent overlap area (COA2), an overlap area of the first bent area (CA1) and the third adjacent hole is defined as a third bent overlap area (COA3), and an overlap area of the first bent area (CA1) and the fourth adjacent hole is defined as a fourth bent overlap area (COA4), wherein a ratio (CR1) of an area of the first bent holes to the first bent area (CA1) satisfies $$CR1 = \frac{COA1 + COA2 + COA3 + COA4}{CA1} \times 100,$$

and the ratio (CR1) of the area of the first bent holes to the first bent area (CA1) is 15% to 25%.

6. The display device of claim 5, wherein four first straight holes adjacent to each other among the first straight holes are defined as a first adjacent straight hole, a second adjacent straight hole, a third adjacent straight hole, and a fourth adjacent straight hole, an area of a quadrangle connecting a center point of the first adjacent straight hole, a center point of the second adjacent straight hole, a center point of the third adjacent straight hole, and a center point of the fourth adjacent straight hole is defined as a first straight area (SA1), an overlap area of the first straight area (SA1) and the first adjacent straight hole is defined as a first straight overlap area (SOA1), an overlap area of the first straight area (SA1) and the second adjacent straight hole is defined as a second straight overlap area (SOA2), an overlap area of the first straight area (SA1) and the third adjacent straight hole is defined as a third straight overlap area (SOA3), and an overlap area of the first straight area SA1 and the fourth adjacent straight hole is defined as a fourth straight overlap area (SOA4), wherein a ratio (SR1) of an area of the first straight holes to the first straight area (SA1) satisfies $$SR1 = \frac{SOA1 + SOA2 + SOA3 + SOA4}{SA1} \times 100,$$

and the ratio (SR1) of the area the first straight holes to the first straight area (SA1) is 15% to 25%.

7. The display device of claim 6, wherein a difference between the ratio (SR1) of the first straight holes to the first straight area (SA1) and the ratio (CR1) of the first bent holes to the first bent area (CA1) is less than 1%.

8. The display device of claim 1, further comprising:

a second driving voltage line disposed in the non-display area, having the straight portion and the bent portion, and electrically connected to the first driving voltage line, wherein the second driving voltage line includes a plurality of second straight holes arranged in the straight portion and a plurality of second bent holes arranged in the bent portion, and the first straight holes, the second straight holes, the first bent holes, and the second bent holes do not overlap each other in the plan view.

9. The display device of claim 8,
wherein the second bent hole and the second straight hole have different sizes from each other, and
wherein the second bent hole and the second straight hole are adjacent to each other in a longitudinal direction of the second driving voltage line.

10. The display device of claim 8,
wherein two second bent holes among the second bent holes have different sizes from each other, and
wherein the two second bent holes are adjacent to each other in a latitudinal direction of the second driving voltage line.

11. The display device of claim 10,
wherein first one of the two second bent holes is disposed outside second one of the two second bent holes, and
the size of the first one is larger than the size of the second one.

12. The display device of claim 8,
wherein, a distance between two second straight holes among the plurality of second straight holes is the same as a distance between the second bent hole and the second straight hole, and
wherein the two second straight holes are adjacent to each other in the longitudinal direction of the second driving voltage line.

13. The display device of claim 8,
wherein a size of the second straight hole is the same as the size of the first straight hole.

14. The display device of claim 8,
wherein the sub-pixel includes:
a pixel transistor including a gate electrode, a source electrode, and a drain electrode;
a connection electrode disposed on a first planarization layer disposed on the pixel transistor and connected to the source electrode and the drain electrode; and
a pixel electrode disposed on a second planarization layer disposed on the connection electrode and connected to the connection electrode.

15. The display device of claim 14,
wherein the first driving voltage line disposed on the second planarization layer includes a same material as the pixel electrode.

16. The display device of claim 14,
wherein the second driving voltage line disposed on the first planarization layer includes a same material as the connection electrode.

17. The display device of claim 1,
wherein the first driving voltage line includes a plurality of third straight holes arranged in the straight portion and a plurality of third bent holes disposed in the bent portion, and
a size of the third bent hole is larger than a size of the third straight hole.

18. The display device of claim 17,
wherein a distance between two third straight holes of the plurality of third straight holes is the same as a distance between the third bent hole and the third straight hole adjacent to each other in the longitudinal direction of the first driving voltage line, and
wherein the two third straight holes are adjacent to each other in the longitudinal direction of the first driving voltage line.

19. The display device of claim 17,
wherein the size of the third straight hole is larger than the size of the first straight hole.

20. A display device defining a display plane perpendicular to a thickness direction, the display device comprising:
a substrate including a first side, a second side, and a first corner, wherein the first corner is round and at which the first side meets the second side, the first side, the second side, and the first corner being within the display plane or a first plane parallel to the display plane;
a display area disposed on the substrate and including pixels for displaying an image; and
a driving voltage line disposed at the first side and the first corner in a non-display area adjacent to the display area,
wherein the driving voltage line includes a straight portion defining a plurality of straight holes and a bent portion defining a plurality of bent holes, is disposed linearly in the straight portion, and is bent within the display plane or within a second plane parallel to the display plane in the bent portion,
wherein two bent holes among the plurality of bent holes have different sizes from each other,
wherein the two bent holes are adjacent to each other in a latitudinal direction of the driving voltage line,
wherein first one of the two bent holes is disposed outside second one of the two bent holes, and
wherein the size of the first one along the longitudinal direction of the first driving voltage line is larger than the size of the second one along a longitudinal direction of the driving voltage line.

21. The display device of claim 20,
wherein one of the plurality of bent holes and one of the plurality of straight holes have different sizes from each other along a longitudinal direction of the driving voltage line, and
wherein the one of the plurality of bent holes and the one of the plurality of straight holes are adjacent to each other in the longitudinal direction of the driving voltage line.

22. The display device of claim 21,
wherein the size of the one of the plurality of bent holes along the longitudinal direction of the first driving voltage line is larger than the size of the one of the plurality of straight holes along the longitudinal direction of the driving voltage line.

23. The display device of claim 21,
wherein a distance between two straight holes among the plurality of straight holes is the same as a distance between the one of the plurality of bent holes and the one of the plurality of straight holes adjacent to each other, and
wherein the two straight holes are adjacent to each other in the longitudinal direction of the driving voltage line.

* * * * *